United States Patent
Li et al.

(10) Patent No.: US 12,317,687 B2
(45) Date of Patent: May 27, 2025

(54) DISPLAY SUBSTRATE AND PREPARATION METHOD THEREOF, AND DISPLAY APPARATUS

(71) Applicants: Hefei BOE Joint Technology Co.,Ltd., Anhui (CN); BOE Technology Group Co., Ltd., Beijing (CN)

(72) Inventors: Meng Li, Beijing (CN); Yongqian Li, Beijing (CN); Chen Xu, Beijing (CN); Dacheng Zhang, Beijing (CN); Jingquan Wang, Beijing (CN); Zhidong Yuan, Beijing (CN); Haixia Xu, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 1132 days.

(21) Appl. No.: 17/270,414

(22) PCT Filed: May 15, 2020

(86) PCT No.: PCT/CN2020/090586
§ 371 (c)(1),
(2) Date: Feb. 22, 2021

(87) PCT Pub. No.: WO2021/227040
PCT Pub. Date: Nov. 18, 2021

(65) Prior Publication Data
US 2022/0123073 A1   Apr. 21, 2022

(51) Int. Cl.
*H10K 59/12*   (2023.01)
*H10K 59/122*   (2023.01)
(Continued)

(52) U.S. Cl.
CPC ......... *H10K 59/122* (2023.02); *H10K 59/126* (2023.02); *H10K 59/1315* (2023.02);
(Continued)

(58) Field of Classification Search
CPC ........ H10K 59/12; H10K 59/35; H10K 59/40; H10K 59/124; H10K 59/123; H10K 59/87;
(Continued)

(56) References Cited

U.S. PATENT DOCUMENTS

2003/0107314 A1 *   6/2003   Urabe .................. H10K 50/865
313/506
2014/0332769 A1   11/2014   Lee et al.
(Continued)

FOREIGN PATENT DOCUMENTS

CN   104009062 A   8/2014
CN   104143561 A   11/2014
(Continued)

OTHER PUBLICATIONS

European Search Report for EP20900761.6 Mailed Jul. 26, 2022.

*Primary Examiner* — Chuong A Luu
(74) *Attorney, Agent, or Firm* — Ling Wu; Stephen Yang; Ling and Yang Intellectual Property

(57) ABSTRACT

Provided are a display substrate and a preparation method thereof, and a display apparatus. The display substrate includes a plurality of display units; the display unit includes a driving structure layer, a light emitting structure layer and a color filter layer which are located in the display area and sequentially arranged on the substrate; the light emitting structure layer comprises a plurality of light emitting structures each including a pixel define layer and an organic light emitting layer; the organic light emitting layer is located in an opening area of the pixel define layer and on the pixel (Continued)

define layer; the color filter layer includes a plurality of light filters; the display substrate includes a spacing area located in the display area, the spacing area being located between opening areas of pixel define layers of adjacent light emitting structures.

19 Claims, 18 Drawing Sheets

(51) Int. Cl.
*H10K 59/126* (2023.01)
*H10K 59/131* (2023.01)
*H10K 59/38* (2023.01)
*H10K 71/00* (2023.01)

(52) U.S. Cl.
CPC .............. *H10K 59/38* (2023.02); *H10K 71/00* (2023.02); *H10K 59/1201* (2023.02)

(58) Field of Classification Search
CPC .... H10K 59/38; H10K 59/122; H10K 59/126; H10K 59/131; H10K 59/1201; H10K 59/1315; H10K 59/351; H10K 59/353; H10K 59/8792; H10K 59/8731; H10K 59/80522; H10K 59/80515; H10K 71/00
USPC ........................................................ 257/40
See application file for complete search history.

(56) References Cited

U.S. PATENT DOCUMENTS

| 2016/0035803 | A1  | 2/2016  | Kim et al. |
| 2016/0334553 | A1  | 11/2016 | Wu et al. |
| 2016/0365397 | A1* | 12/2016 | Seo ...................... H10K 59/352 |
| 2017/0193876 | A1* | 7/2017  | Choi .................... H10K 59/131 |
| 2017/0236880 | A1  | 8/2017  | Kubota |
| 2019/0006429 | A1  | 1/2019  | Ota |
| 2021/0005160 | A1* | 1/2021  | Lee ....................... G09G 3/3225 |

FOREIGN PATENT DOCUMENTS

| CN | 110047890 A | 7/2019 |
| CN | 110718575 A | 1/2020 |

\* cited by examiner

DISPLAY SUBSTRATE AND PREPARATION METHOD THEREOF, AND DISPLAY APPARATUS

TECHNICAL FIELD

The present disclosure relates to, but is not limited to, the field of display technology, and particularly relates to a display substrate and a preparation method thereof, and a display apparatus.

BACKGROUND

An Organic Light Emitting Diode (OLED) is an active light emitting display device, and has the advantages of light emission, ultra-thinness, a wide viewing angle, high brightness, a high contrast, low power consumption, an extremely high response speed, etc. With the continuous development of display technology, OLED technology is increasingly used in flexible display apparatuses, and has gradually become a next generation display technology with great development prospects. According to different driving modes, OLEDs may be divided into two types, Passive Matrix (PM) type and Active Matrix (AM) type. An AMOLED is a current-driven device, in which an independent Thin Film Transistor (TFT) is used to control each sub-pixel, and each sub-pixel may be continuously and independently driven to emit light.

With the continuous development of display technology, the OLED technology is increasingly used in transparent display. Transparent display is an important personalized display field of display technology, which refers to that images are displayed in a transparent state, so that a viewer can see not only images in a display apparatus, but also scenes behind the display apparatus, thereby Virtual Reality (VR), Augmented Reality (AR) and 3D display functions can be achieved. In a transparent display apparatus using the AMOLED technology, each pixel is generally divided into a display area and a transparent area. In the display area, pixel driving circuits and light emitting elements are arranged to implement image display, and the transparent area allows light to pass through.

SUMMARY

The following is a summary of subject matter described in detail herein. This summary is not intended to limit the protection scope of the claims.

In a first aspect, the present disclosure provides a display substrate, including a substrate and a plurality of display units arranged on the substrate. The display unit includes a display area and a transparent area. The display unit includes a driving structure layer, a light emitting structure layer and a color filter layer which are located in the display area and sequentially arranged on the substrate. The light emitting structure layer includes a plurality of light emitting structures each including a pixel define layer, a first electrode, an organic light emitting layer and a second electrode. The organic light emitting layer is located in an opening area of the pixel define layer and on the pixel define layer. The color filter layer includes a plurality of light filters.

The display substrate includes a spacing area located in the display area. The spacing area is located between opening areas of pixel define layers of adjacent light emitting structures, and there is an overlapping area between an orthographic projection of the spacing area on the substrate and an orthographic projection of the pixel define layer on the substrate.

There is an overlapping area between orthographic projections of adjacent light filters on the substrate, and there is an overlapping area between an orthographic projection of an overlapping area of adjacent light filters on the substrate and the orthographic projection of the spacing area on the substrate.

In some possible implementations, the plurality of light emitting structures include a first light emitting structure, a second light emitting structure, a third light emitting structure and a fourth light emitting structure. The first light emitting structure and the second light emitting structure are arranged in a first direction, the third light emitting structure and the fourth light emitting structure are arranged in the first direction, the first light emitting structure and the third light emitting structure are arranged in a second direction, and the second light emitting structure and the fourth light emitting structure are arranged in the second direction.

The plurality of light filters include a light filter of a first color, a light filter of a second color and a light filter of a third color. The light filters of the three colors are respectively arranged on three of the four light emitting structures.

The first direction is an arrangement direction of the transparent area and the display area in one display unit, the second direction is perpendicular to the first direction, the first color, the second color and the third color are respectively one of red, blue and green, and the three colors are different from each other.

In some possible implementations, the driving structure layer includes: a plurality of first scanning lines and second scanning lines extending in the first direction, a plurality of first power supply lines, second power supply lines, data lines and compensation lines extending in the second direction, and a first driving structure, a second driving structure, a third driving structure and a fourth driving structure which are arranged in the first direction.

The first driving structure is located on a side of the second driving structure close to the transparent area, and the fourth driving structure is located on a side of the third driving structure away from the transparent area.

The first power supply lines are located on a side of the fourth driving structure away from the third driving structure; the second power supply lines are located on a side of the first driving structure away from the second driving structure; and the compensation lines are located between the second driving structure and the third driving structure.

The data lines include: a first data line, a second data line, a third data line and a fourth data line.

The first data line is connected with the first driving structure and located on a side of the first driving structure close to the second driving structure; the second data line is connected with the second driving structure and located on a side of the second driving structure close to the first driving structure; the third data line is connected with the third driving structure and located on a side of the third driving structure close to the fourth driving structure; and the fourth data line is connected with the fourth driving structure and located on a side of the fourth driving structure close to the third driving structure.

The first scanning lines and the second scanning lines are located on the two sides of the driving structure layer, respectively.

A length of the first power supply line in the first direction is greater than a length of the compensation line or the data line in the first direction, and a length of the second power supply line in the first direction is greater than a length of the compensation line or the data line in the first direction.

In some possible implementations, the first driving structure and the fourth driving structure are mirror symmetric with respect to the compensation line, and the second driving structure and the third driving structure are mirror symmetric with respect to the compensation line.

In some possible implementations, each driving structure includes a pixel driving circuit. The pixel driving circuit includes: a first transistor, a second transistor, a third transistor and a storage capacitor. The second transistor is a driving transistor. The storage capacitor includes a first plate, a second plate and a third plate.

A gate electrode of the first transistor is connected with the first scanning line, a first electrode of the first transistor is connected with the data line, a second electrode of the first transistor is connected with a gate electrode of the second transistor, a first electrode of the second transistor is connected with the first power supply line, a second electrode of the second transistor is connected with the first electrode of the light emitting structure, a gate electrode of the third transistor is connected with the second scanning line, a first electrode of the third transistor is connected with the compensation line through a compensation connection line, a second electrode of the third transistor is connected with the second electrode of the second transistor, the second electrode of the light emitting structure is connected with the second power supply line, the first plate and the third plate are connected with the second electrode of the second transistor, and the second plate is connected with the gate electrode of the second transistor.

The driving structure layer further includes: a power supply connection line, an auxiliary power supply line and a compensation connection line.

The first electrode of the second transistor is connected with the first power supply line through the power supply connection line; the power supply connection line is arranged on the same layer as the first scanning line and the second scanning line, the first power supply line is connected with the power supply connection line through a via hole, and a double-layer routing is formed between the gate electrode of the first transistor and the gate electrode of the third transistor.

The auxiliary power supply line is arranged on the same layer as the first scanning line and the second scanning line, the second power supply line is connected with the auxiliary power supply line through a via hole, and a double-layer routing is formed between the gate electrode of the first transistor and the gate electrode of the third transistor.

The compensation connection line is arranged on the same layer as the first plate, and is connected with the compensation line through a via hole.

In some possible implementations, the driving structure layer includes: a first metal layer, a first insulating layer, a metal oxide layer, a second insulating layer, a second metal layer, a third insulating layer, a third metal layer, a fourth insulating layer and a flat layer which are sequentially stacked.

The first metal layer includes a first plate and a compensation connection line, the metal oxide layer includes a second plate and active layers of all transistors, the second metal layer includes a first scanning line, a second scanning line, a power supply connection line, an auxiliary power supply line and gate electrodes of all transistors, the third metal layer includes a first power supply line, a second power supply line, a compensation line, a data line, a third plate and source and drain electrodes of all transistors, and the flat layer is provided with a via hole exposing the second electrode of the second transistor.

There is an overlapping area between an orthographic projection of the first plate on the substrate and an orthographic projection of the second plate on the substrate to form a first storage capacitor, and there is an overlapping area between an orthographic projection of the third plate on the substrate and an orthographic projection of the second plate on the substrate to form a second storage capacitor. The third plate is connected with the first plate through a via hole.

In some possible implementations, the orthographic projection of the first plate on the substrate covers orthographic projections of the active layers of the first transistor and the second transistor and the second plate on the substrate.

A length of the first plate in the second direction is greater than a distance between the gate electrode of the first transistor and the gate electrode of the third transistor.

In some possible implementations, the second plates in the second driving structure and the third driving structure are provided with an opening respectively; the opening of the second plate of the second driving structure is arranged on a side of the second driving structure close to the third driving structure, and the opening of the second plate of the third driving structure is arranged on a side of the third driving structure close to the second driving structure.

The via holes of the flat layers in the first driving structure and the fourth driving structure are located between the third transistor and the second plate, and the via hole of the flat layer in the first driving structure and the via hole of the flat layer in the fourth driving structure are mirror symmetric with respect to the compensation line.

The via hole of the flat layer of the second driving structure is located in the opening of the second plate of the second driving structure, and the via hole of the flat layer of the third driving structure is located in the opening of the second plate of the third driving structure; and the via hole of the flat layer in the second driving structure and the via hole of the flat layer in the third driving structure are mirror symmetric with respect to the compensation line.

An included angle between an arrangement direction of the via hole of the flat layer in the first driving structure and the via hole of the flat layer in the second driving structure and the first direction is greater than 0 degree and smaller than 90 degrees.

In some possible implementations, the first electrode of the first light emitting structure is connected with the first driving structure through the via hole of the flat layer in the first driving structure, the first electrode of the second light emitting structure is connected with the fourth driving structure through the via hole of the flat layer in the third driving structure, the first electrode of the third light emitting structure is connected with the second driving structure through the via hole of the flat layer in the second driving structure, and the first electrode of the fourth light emitting structure is connected with the third driving structure through the via hole of the flat layer in the third driving structure.

The opening area of the pixel define layer of the first light emitting structure and the opening area of the pixel define layer of the third light emitting structure are located between the first power supply line and the compensation line, and there is an overlapping area between the orthographic projections of the opening area of the pixel define layer of the first light emitting structure and the opening area of the pixel define layer of the third light emitting structure on the substrate and the orthographic projections of the first driving structure and the second driving structure on the substrate.

The opening area of the pixel define layer of the second light emitting structure and the opening area of the pixel define layer of the fourth light emitting structure are located between the compensation line and the second power supply line, and there is an overlapping area between the orthographic projections of the opening area of the pixel define layer of the second light emitting structure and the opening area of the pixel define layer of the fourth light emitting structure on the substrate and the orthographic projections of the third driving structure and the fourth driving structure on the substrate.

In some possible implementations, there is no overlapping area between the orthographic projection of the via hole of the flat layer of the first driving structure on the substrate and the orthographic projection of the opening area of the pixel define layer in the first light emitting structure on the substrate.

There is no overlapping area between the orthographic projection of the via hole of the flat layer of the second driving structure on the substrate and the orthographic projection of the opening area of the pixel define layer in the third light emitting structure on the substrate.

There is no overlapping area between the orthographic projection of the via hole of the flat layer of the third driving structure on the substrate and the orthographic projection of the opening area of the pixel define layer in the fourth light emitting structure on the substrate.

There is no overlapping area between the orthographic projection of the via hole of the flat layer of the fourth driving structure on the substrate and the orthographic projection of the opening area of the pixel define layer in the second light emitting structure on the substrate.

In some possible implementations, the spacing area includes a first spacing area, a second spacing area and a third spacing area.

The first spacing area is located between the opening area of the pixel define layer of the first light emitting structure and the opening area of the pixel define layer of the third light emitting structure, and the second spacing area is located between the opening area of the pixel define layer of the second light emitting structure and the opening area of the pixel define layer of the fourth light emitting structure; and the first spacing area and the second spacing area are arranged in the first direction.

The first spacing area and the second spacing area are located on the two sides of the third spacing area, respectively, and the orthographic projection of the third spacing area on the substrate coincides with the orthographic projection of the compensation line between the first scanning line and the second scanning line on the substrate.

The third spacing area includes: a first sub-spacing area, a second sub-spacing area and a third sub-spacing area which are sequentially arranged in the second direction and connected end to end; and the second sub-spacing area is located between the first sub-spacing area and the third sub-spacing area.

The first sub-spacing area is located between the opening area of the pixel define layer of the first light emitting structure and the opening area of the pixel define layer of the second light emitting structure; and the third sub-spacing area is located between the opening area of the pixel define layer of the third light emitting structure and the opening area of the pixel define layer of the fourth light emitting structure.

The second sub-spacing area is located between the first spacing area and the second spacing area, and is arranged in the first direction with the first spacing area and the second spacing area.

In some possible implementations, when the light filters are located on the first light emitting structure, the orthographic projection of the light filters on the substrate covers the orthographic projections of the opening area of the pixel define layer of the first light emitting structure, the first sub-spacing area and the second sub-spacing area on the substrate, and overlaps with the orthographic projections of partial second scanning lines and partial second power supply lines in the display area on the substrate.

When the light filters are located on the second light emitting structure, the orthographic projection of the light filters on the substrate covers the orthographic projections of the opening area of the pixel define layer of the second light emitting structure, the second spacing area, the first sub-spacing area and the second sub-spacing area on the substrate, and overlaps with the orthographic projections of partial second scanning lines and partial first power supply lines in the display area on the substrate.

When the light filters are located on the third light emitting structure, the orthographic projection of the light filters on the substrate covers the orthographic projection of the opening area of the pixel define layer of the third light emitting structure on the substrate, and overlaps with the orthographic projections of partial first spacing area, partial third sub-spacing area, and partial first scanning lines and partial second power supply lines in the display area on the substrate.

When the light filters are located on the fourth light emitting structure, the orthographic projection of the light filters on the substrate covers the orthographic projection of the opening area of the pixel define layer of the fourth light emitting structure on the substrate, and overlaps with the orthographic projections of partial second spacing area, partial third sub-spacing area, and partial first scanning lines and partial first power supply lines in the display area on the substrate.

There is no overlapping area between the orthographic projection of the color filter layer on the substrate and the orthographic projection of the via hole of the flat layer in the driving structure layer on the substrate.

In some possible implementations, the display substrate further includes a shielding layer.

There is an overlapping area between an orthographic projection of the shielding layer on the substrate and the orthographic projections of the first scanning lines in the transparent area and the second scanning lines in the transparent area and part of the display area on the substrate.

In some possible implementations, the shielding layer includes a first shielding layer and a second shielding layer. The second shielding layer is located on a side of the first shielding layer close to the substrate.

The first shielding layer is arranged on the same layer as light filters of one color among the plurality of light filters, and the second shielding layer is arranged on the same layer as light filters of another color among the plurality of light filters.

In a second aspect, the present disclosure further provides a method for preparing a display substrate, which is used for preparing the above display substrate, the method including:
    providing a substrate; and
    forming a display unit including a display area and a transparent area on the substrate to form a display substrate; the display unit including a driving structure layer, a light emitting structure layer and a color filter layer which are located in the display area and sequentially arranged on the substrate; the light emitting structure layer including a plurality of light emitting structures each including a pixel define layer, a first electrode, an organic light emitting layer and a second electrode; the organic light emitting layer being located in an opening area of the pixel define layer and on the pixel define layer; the display substrate including a spacing area located in the display area, the spacing area being located between opening areas of pixel define layers of adjacent light emitting structures, and there being an overlapping area between an orthographic projection of the spacing area on the substrate and an orthographic projection of the pixel define layer on the substrate; the color filter layer including a plurality of light filters; there being an overlapping area between orthographic projections of adjacent light filters on the substrate; and there being an overlapping area between an orthographic projection of an overlapping area of adjacent light filters on the substrate and the orthographic projection of the spacing area on the substrate.

In some possible implementations, the forming a display unit including a display area and a transparent area on the substrate includes:

forming on the substrate a first metal layer which is located in the display area and includes a first plate;

forming a first insulating layer which covers the first metal layer and is located in the display area and the transparent area;

forming on the first insulating layer a metal oxide layer which is located in the display area and includes a second plate, there being an overlapping area between an orthographic projection of the second plate on the substrate and an orthographic projection of the first plate on the substrate to form a first storage capacitor;

sequentially forming a second insulating layer and a second metal layer which are located in the display area, the second metal layer including a first scanning line and a second scanning line;

forming a third insulating layer which covers the second metal layer and is located in the display area and the transparent area;

forming on the third insulating layer a third metal layer which is located in the display area, the third metal layer including a first power supply line, a second power supply line, a compensation line, a data line and a third plate, there being an overlapping area between an orthographic projection of the third plate on the substrate and the orthographic projection of the second plate on the substrate to form a second storage capacitor, and the third plate being connected with the first plate through a via hole;

forming a fourth insulating layer and a flat layer which cover the third metal layer and are located in the display area and the transparent area;

forming a first electrode on the flat layer;

sequentially forming a pixel define layer, an organic light emitting layer and a cathode;

forming an encapsulation layer; and forming a color filter layer on the encapsulation layer.

In some possible implementations, the forming a color filter layer on the encapsulation layer includes:

forming a color filter layer and a shielding layer on the encapsulation layer;

there being an overlapping area between an orthographic projection of the shielding layer on the substrate and orthographic projections of the first scanning line in the transparent area and the second scanning line in the transparent area and part of the display area on the substrate.

In a third aspect, the present disclosure further provides a display apparatus, including the display substrate described above.

Other aspects will become apparent upon reading and understanding the accompanying drawings and the detailed description.

BRIEF DESCRIPTION OF DRAWINGS

The accompanying drawings are used to provide a further understanding of the technical solutions of the present disclosure and form a part of the specification. Together with the embodiments of the present disclosure, they are used to explain the technical solutions of the present disclosure and do not constitute a limitation on the technical solutions of the present disclosure. The shapes and dimensions of the components in the drawings do not reflect real proportions, and are only for the purpose of schematically illustrating contents of the present disclosure.

DETAILED DESCRIPTION

Figure 1A:
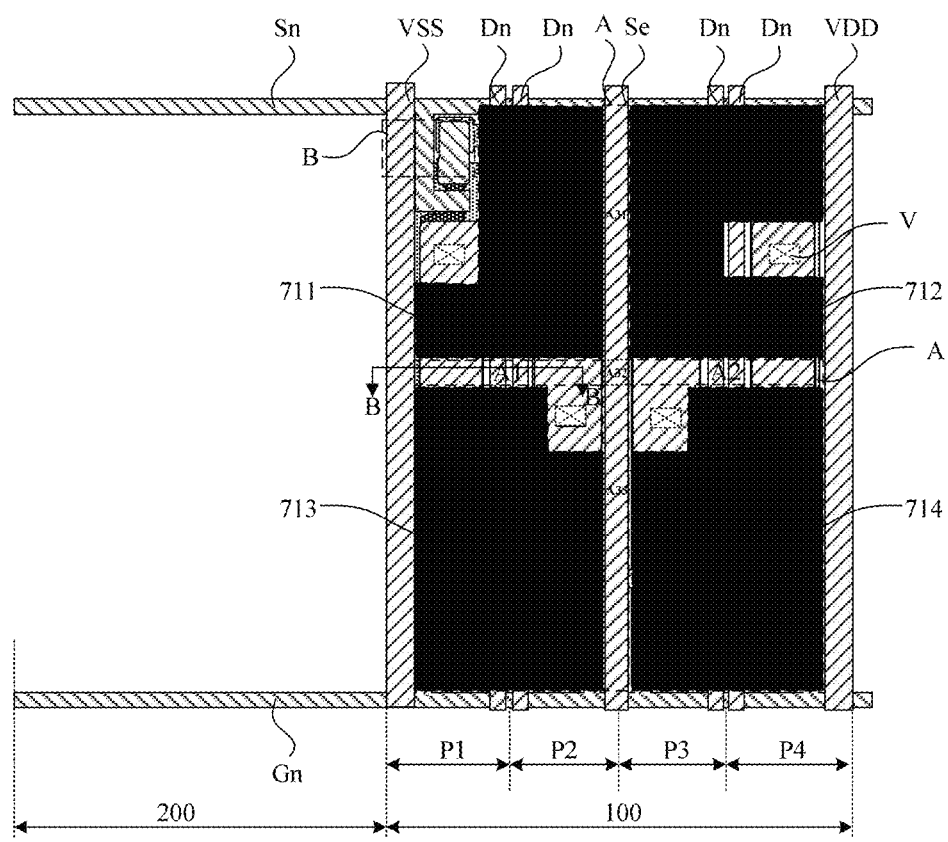
FIG. 1A is a first top view of a display substrate according to an embodiment of the present disclosure.

To make the objects, technical solutions and advantages of the present disclosure more clear, embodiments of the present disclosure will be described in detail below with reference to the accompanying drawings. The embodiments may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, the size of a constituent element, or the thickness or area of a layer, is sometimes exaggerated for clarity. Therefore, an implementation of the present disclosure is not necessarily limited to the size shown, and the shapes and sizes of the components in the drawings do not reflect true proportions. In addition, the drawings schematically show ideal examples, and an implementation of the present disclosure is not limited to the shapes or values shown in the drawings.

The ordinal numbers such as "first", "second" and "third" in the specification are used to avoid confusion of constituent elements, but not to limit in quantity.

In this specification, for convenience, words and phrases indicating an orientation or positional relationship, such as "middle", "upper", "lower", "front", "rear", "vertical", "horizontal", "top", "bottom", "inner" and "outer", are used to describe the positional relationship of constituent elements with reference to the drawings, which are only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure. The positional relationship of the constituent elements is appropriately changed according to the direction in which each constituent element is described. Therefore, the words and phrases are not limited to those described in the specification, but may be replaced as appropriate according to the situation.

In this specification, unless otherwise clearly specified or defined, the terms "install", "connect" and "link" should be broadly interpreted, which, for example, may be fixed connection, detachable connection, or integral connection; may be a mechanical connection or an electrical connection; and may be direct connection, indirect connection through an intermediary, or an internal connection between two elements.

A transistor refers to an element including at least three terminals, namely a gate electrode, a drain electrode and a source electrode. The transistor has a channel region between the drain electrode (a drain terminal, a drain region or a drain electrode) and the source electrode (a source electrode terminal, a source region or a source electrode), and current can flow through the drain electrode, the channel region and the source electrode. In this specification, the channel region refers to a region through which current mainly flows.

A first electrode may be a drain electrode and a second electrode may be a source electrode, or a first electrode may be a source electrode and a second electrode may be a drain electrode. In a case where transistors with opposite polarities are used or the direction of current changes during circuit operation, the functions of the "source electrode" and the "drain electrode" are sometimes interchanged. Therefore, in this specification, "source electrode" and "drain electrode" may be interchanged.

In this specification, "electrical connection" includes a case where the constituent elements are connected together by an element having a certain electrical function. The "element having a certain electrical function" is not particularly limited as long as it can transmit and receive electrical signals between connected constituent components. Examples of the "element having a certain electrical function" not only include electrodes and wirings, but also include switching elements such as transistors, resistors, inductors, capacitors, and other elements with various functions.

In this specification, "parallel" refers to a state in which an angle formed by two straight lines is −10 degrees or more and 10 degrees or less, and thus also includes a state in which the angle is −5 degrees or more and 5 degrees or less. In addition, "vertical" refers to a state in which an angle formed by two straight lines is 80 degrees or more and 100 degrees or less, and thus also includes a state of an angle of 85 degrees or more and 95 degrees or less.

In this specification, "film" and "layer" can be interchanged. For example, "conductive layer" can sometimes be replaced by "conductive film". Similarly, "insulating film" can sometimes be replaced by "insulating layer".

In a transparent display substrate, since a pixel define layer covering a metal located between adjacent light emitting structures is a transparent material, metal reflection may occur, which deteriorates the display effect of the transparent display substrate.

Figure 1B:
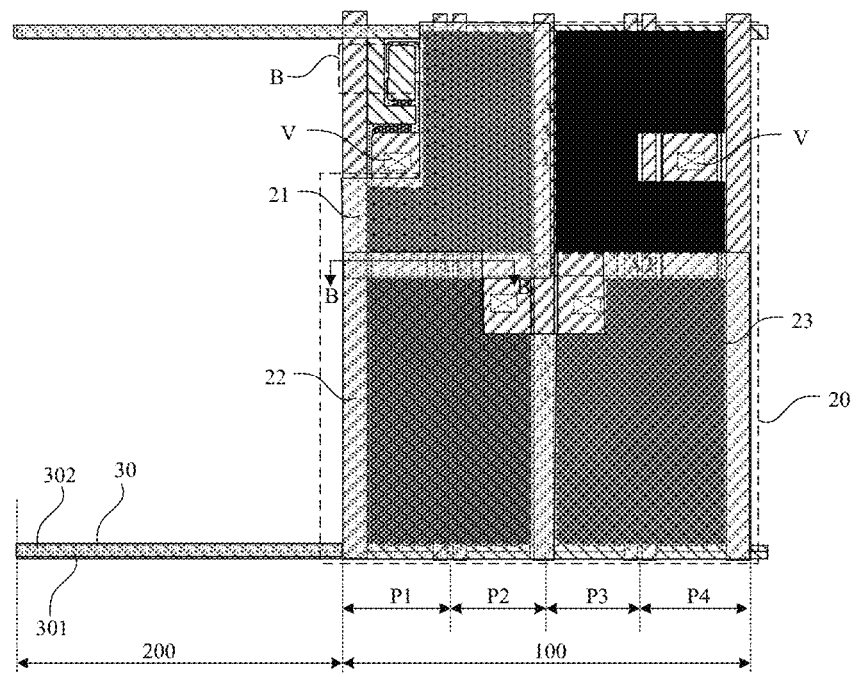
FIG. 1B is a second top view of a display substrate according to an embodiment of the present disclosure.
Figure 2:
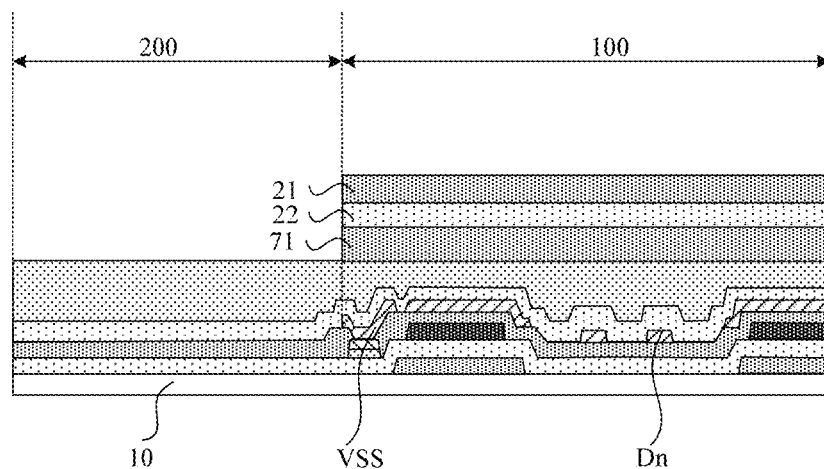
FIG. 2 is a sectional view of FIG. 1B in a B-B direction.

FIG. 1A is a first top view of a display substrate according to an embodiment of the present disclosure, FIG. 1B is a second top view of a display substrate according to an embodiment of the present disclosure, and FIG. 2 is a sectional view of FIG. 1B in a B-B direction. As shown in FIGS. 1 and 2, a display substrate according to an embodiment of the present disclosure includes: a substrate 10 and a plurality of display units arranged on the substrate 10. The display unit includes a display area 100 and a transparent area 200. The display unit includes a driving structure layer, a light emitting structure layer and a color filter layer which are located in the display area 100 and sequentially arranged on the substrate. The light emitting structure layer includes a plurality of light emitting structures each including a pixel define layer 71, a first electrode, an organic light emitting layer and a second electrode. The organic light emitting layer is located in an opening area of the pixel define layer and on the pixel define layer 71. The color filter layer 20 includes a plurality of light filters.

As shown in FIG. 1A, the display substrate 1 includes a spacing area A (an area with dotted lines in FIG. 1A) located in the display area. The spacing area A is located between opening areas of pixel define layers of adjacent light emitting structures, and there is an overlapping area between an orthographic projection of the spacing area A on the substrate and an orthographic projection of the pixel define layer 71 on the substrate.

There is an overlapping area between orthographic projections of adjacent light filters on the substrate, and there is an overlapping area between an orthographic projection of an overlapping area of adjacent light filters on the substrate and the orthographic projection of the spacing area on the substrate.

The plurality of light filters include light filters of first color, light filters of second color and light filters of third color. The first color, the second color and the third color are respectively one of red, blue and green, and the three colors being different from each other. The first color may be red, the second color may be blue, and the third color may be green; or the first color may be red, the second color may be green, and the third color may be blue; or the first color may be blue, the second color may be red, and the third color may be green; or the first color may be blue, the second color may be green, and the third color may be red; or the first color may be green, the second color may be red, and the third color may be blue; or the first color may be green, the second color may be blue, and the third color may be red.

The display area is configured to implement image display, and the transparent area is configured to allow light to pass through, thereby implementing image display in a transparent state, i.e., transparent display.

In an exemplary embodiment, the substrate 10 may be a rigid substrate or a flexible substrate, wherein the rigid substrate may be, but is not limited to, one or more of glass and metal foils; and the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, as shown in FIG. 1A, the plurality of light emitting structures include a first light emitting structure, a second light emitting structure, a third light emitting structure and a fourth light emitting structure. The first light emitting structure and the second light emitting structure are arranged in the first direction, and the third light emitting structure and the fourth light emitting structure are arranged in the first direction; and the first light emitting structure and the third light emitting structure are arranged in the second direction, and the second light emitting structure and the fourth light emitting structure are arranged in the second direction.

The first direction is an arrangement direction of the transparent area 200 and the display area 100 in one display unit, and the second direction is perpendicular to the first direction.

There is a spacing between the opening area 711 of the pixel define layer of the first light emitting structure and the opening area 712 of the pixel define layer of the second light emitting structure and between the opening area 711 of the pixel define layer of the first light emitting structure and the opening area 713 of the pixel define layer of the third light emitting structure. There is a spacing between the opening area 714 of the pixel define layer of the fourth light emitting structure and the opening area 712 of the pixel define layer of the second light emitting structure and between the opening area 714 of the pixel define layer of the fourth light emitting structure and the opening area 713 of the pixel define layer of the third light emitting structure.

In an exemplary embodiment, the light filters of the three colors are respectively arranged on three of the four light emitting structures. FIG. 1B illustrates an example in which the light filter of the first color is located on the first light emitting structure, the light filter of the second color is located on the third light emitting structure, and the light filter of the third color is located on the fourth light emitting structure.

In an embodiment of the present disclosure, the adjacent light filters overlapping with each other may have a function of shielding light reflected by the metal located in the spacing area, which can weaken the metal reflection phenomenon and improve the display effect of the display substrate.

In an exemplary embodiment, an area B located in the display area may be used for forming an auxiliary electrode connected with the second electrode of the light emitting structure layer, so as to provide a low-level signal to the second electrode.

The display substrate according to an embodiment of the present disclosure includes a display substrate and a second substrate which are oppositely arranged. The display substrate includes a substrate and a plurality of display units arranged on the substrate. The display unit includes a display area and a transparent area. The display unit includes a driving structure layer, a light emitting structure layer and a color filter layer which are located in the display area and sequentially arranged on the substrate. The light emitting structure layer includes a plurality of light emitting structures each including a pixel define layer, a first electrode, an organic light emitting layer and a second electrode. The organic light emitting layer is located in an opening area of the pixel define layer and on the pixel define layer. The color filter layer includes a plurality of light filters. The display substrate includes a spacing area located in the display area. The spacing area is located between opening areas of pixel define layers of adjacent light emitting structures, and there is an overlapping area between the orthographic projection of the spacing area on the substrate and the orthographic projection of the pixel define layer on the substrate. There is an overlapping area between the orthographic projections of adjacent light filters on the substrate, and there is an overlapping area between the orthographic projection of an overlapping area of adjacent light filters on the substrate and the orthographic projection of the spacing area on the substrate. According to the technical solution provided by an embodiment of the present disclosure, by arranging the light filters in the color filter layer to overlap with each other, light to be reflected from the metal in the spacing area can be shielded, thus weakening metal reflection occurring to the display substrate and improving the display effect of the display substrate.

Figure 3:
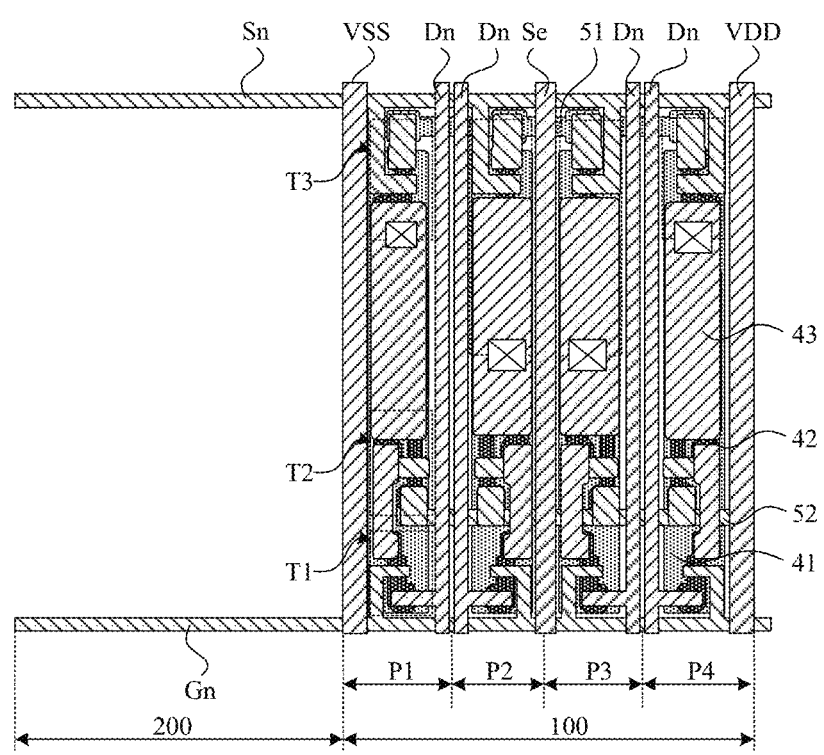
FIG. 3 is a third top view of a display substrate according to an embodiment of the present disclosure.

In an exemplary embodiment, FIG. 3 is a third top view of a display substrate according to an embodiment of the present disclosure. As shown in FIG. 3, the driving structure layer in each display unit includes: a plurality of first scanning lines Gn and second scanning lines Sn extending in the first direction, a plurality of first power supply lines VDD, second power supply lines VSS, data lines Dn and compensation lines Se extending in the second direction, and a first driving structure P1, a second driving structure P2, a third driving structure P3 and a fourth driving structure P4 which are arranged in the first direction.

In an exemplary embodiment, the first power supply lines VDD, the second power supply lines VSS, Dn and the compensation lines Se, the first driving structure P1, the second driving structure P2, the third driving structure P3 and the fourth driving structure P4 are located in the display area.

The first driving structure P1 is located on a side of the second driving structure P2 close to the transparent area 200, and the fourth driving structure P4 is located on a side of the third driving structure P3 away from the transparent area 200. Each driving structure includes a pixel driving circuit. The pixel driving circuit is electrically connected with the light emitting structure.

In an exemplary embodiment, the first scanning line and the second scanning line are used to define a display row, and the first power supply line and the second power supply line are used to define a display column.

The first power supply line VDD is located on a side of the fourth driving structure P4 away from the third driving structure P3, the second power supply line VSS is located on a side of the first driving structure P1 away from the second driving structure P2, and the compensation line Se is located between the second driving structure P2 and the third driving structure P3.

In an exemplary embodiment, the data lines include: a first data line, a second data line, a third data line and a fourth data line. The first data line is connected with the first driving structure, and is located on a side of the first driving structure P1 close to the second driving structure P2. The second data line is connected with the second driving structure P2, and is located on a side of the second driving structure P2 close to the first driving structure P1. The third data line is connected with the third driving structure P3, and is located on a side of the third driving structure P3 close to the fourth driving structure P4. The fourth data line is connected with the fourth driving structure P4, and is located on a side of the fourth driving structure P4 close to the third driving structure P3.

In an exemplary embodiment, the first power supply line VDD, the second power supply line VSS, the compensation line Se and the four data lines Dn are parallel to each other. The second power supply line VSS, two data lines Dn, the compensation line Se, two data lines Dn and the first power supply line VDD are arranged in sequence in a direction away from the transparent area 200. One driving structure is formed between the first power supply line VDD and an adjacent data line Dn, one driving structure is formed between the second power supply line VSS and an adjacent data line Dn, and two driving structures are formed respectively between the compensation line Se and adjacent data lines Dn. In this way, four driving structures are formed between the first power supply line VDD and the second power supply line VSS by arranging one compensation line Se and four data lines Dn. In the four data lines Dn, two data lines Dn are located between the compensation line Se and the second power supply line VSS, and the other two data lines Dn are located between the compensation line Se and the first power supply line VDD.

The length of the first power supply line VDD in the first direction is greater than the length of the compensation line Se or the data line Dn in the first direction, and the length of the second power supply line VSS in the first direction is greater than the length of the compensation line Se or the data line Dn in the first direction, which can reduce the resistances of the first power supply line VDD and the second power supply line VSS.

In an exemplary embodiment, the first scanning line Gn and the second scanning line Sn are located on the two sides of the driving structure layer, respectively.

In an exemplary embodiment, it may be set that a voltage of the first power supply line VDD is greater than a voltage of the second power supply line VSS, and the maximum voltage of a data signal transmitted by the data line Dn is smaller than the maximum voltage of the first scanning line and also smaller than the voltage of the first power supply line VDD.

In an exemplary embodiment, as shown in FIG. 3, the first driving structure P1 and the fourth driving structure P4 are mirror symmetric with respect to the compensation line Se, and the second driving structure P2 and the third driving structure P3 are mirror symmetric with respect to the compensation line Se.

Figure 4:
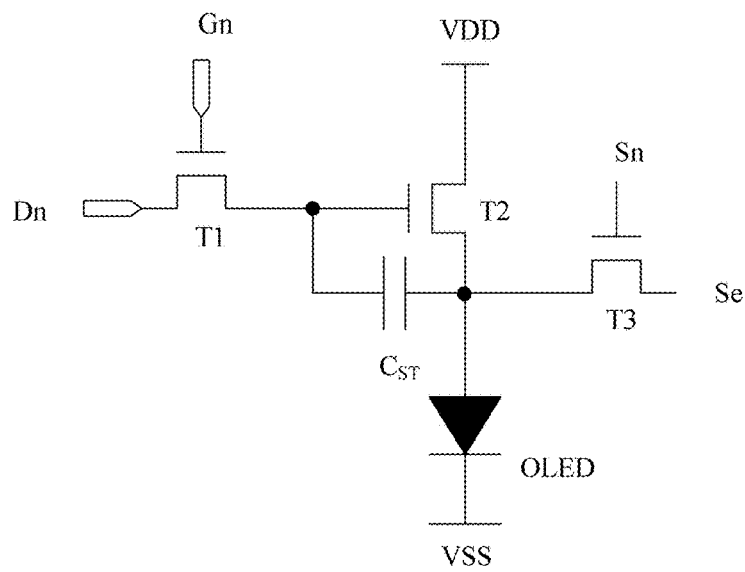
FIG. 4 is an equivalent circuit diagram of a pixel driving circuit according to an exemplary embodiment.

FIG. 4 is an equivalent circuit diagram of a pixel driving circuit according to an exemplary embodiment. As shown in FIG. 4, the pixel driving circuit includes a first transistor T1, a second transistor T2, a third transistor T3 and a storage capacitor $C_{ST}$, and the light emitting structure is an OLED. The first transistor T1 is a switching transistor, the second transistor T2 is a driving transistor, and the third transistor T3 is a compensation transistor. The storage capacitor includes a first plate 41, a second plate 42 and a third plate 43.

A gate electrode of the first transistor T1 is connected with the first scanning line Gn, a first electrode of the first transistor T1 is connected with the data line Dn, and a second electrode of the first transistor T1 is connected with a gate electrode of the second transistor T2. The first transistor T1 is used for receiving, under the control of the first scanning line Gn, a data signal transmitted by the data line Dn, so that the gate electrode of the second transistor T2 receives the data signal. The gate electrode of the second transistor T2 is connected with the second electrode of the first transistor T1, a first electrode of the second transistor T2 is connected with the first power supply line VDD, and a second electrode of the second transistor T2 is connected with a first electrode of the OLED. The second transistor T2 is used for generating, under the control of the data signal received by the gate electrode of the second transistor T2, corresponding current in the second electrode. A gate electrode of the third transistor T3 is connected with the second scanning line Sn, a first electrode of the third transistor T3 is connected with the compensation line Se, and a second electrode of the third transistor T3 is connected with the second electrode of the second transistor T2. The third transistor T3 is used for extracting a threshold voltage Vth and mobility of the second transistor T2 in response to compensation timing to compensate the threshold voltage Vth. The first electrode of the OLED is connected with the second electrode of the second transistor T2, and a second electrode of the OLED is connected with the second power supply line VSS. The OLED is used for emitting light with corresponding brightness in response to the current of the second electrode of the second transistor T2. A first electrode of the storage capacitor $C_{ST}$ is connected with the gate electrode of the second transistor T2, and a second electrode of the storage capacitor $C_{ST}$ is connected with the second electrode of the second transistor T2. The storage capacitor $C_{ST}$ is used for storing a potential of the gate electrode of the second transistor T2.

In an exemplary embodiment, there is at least an overlapping area between an orthographic projection of the first plate 41 on the substrate and an orthographic projection of the second plate 42 on the substrate to form a first storage capacitor, and there is at least an overlapping area between an orthographic projection of the third plate 43 on the substrate and an orthographic projection of the second plate 42 on the substrate to form a second storage capacitor. The first plate 41 is connected with the third plate 43 through a via hole, so that the first plate 41 and the third plate 43 have the same potential, thereby forming a first storage capacitor and a second storage capacitor in a parallel structure.

In an exemplary embodiment, the driving structure layer further includes a plurality of connection lines. The plurality of connection lines at least include a compensation connection line 51, a power supply connection line 52 and an auxiliary power supply line.

In an exemplary embodiment, the compensation connection line 51 is arranged on the same layer as the first plate 41, and the compensation connection line 51 is connected with the compensation line Se through a via hole.

In an exemplary embodiment, the first electrode of the second transistor is connected with the first power supply line VDD through the power supply connection line 52. The power supply connection line 52 is arranged on the same layer as the first scanning line Gn and the second scanning line Sn, and the first power supply line VDD is connected with the power supply connection line 52 through a via hole, to form a double-layer routing between the gate electrode of the first transistor and the gate electrode of the third transistor. To form a double-layer routing between the gate electrode of the first transistor and the gate electrode of the third transistor ensures the reliability of transmission of power signals and reduces the resistance of the first power supply line VDD.

In an exemplary embodiment, the auxiliary power supply line is arranged on the same layer as the first scanning line and the second scanning line, and the second power supply line is connected with the auxiliary power supply line through a via hole, to form a double-layer routing between the gate electrode of the first transistor and the gate electrode of the third transistor. To form a double-layer routing between the gate electrode of the first transistor and the gate electrode of the third transistor ensures the reliability of transmission of power signals and reduces the resistance of the second power supply line VSS.

The compensation connection line 51 is connected with the compensation line Se through a via hole, so that the compensation line Se provides compensation signals to the four driving structures through the compensation connection line 51, and the power supply connection line 52 is connected with first power supply line VDD through a via hole, so that the first power supply line VDD provides power signals to four sub-pixels through the power supply connection line 52, thus forming a one-to-four structure between the first power supply line VDD and the compensation line Se. The first power supply line and the compensation line are designed in the one-to-four structure, which saves the number of signal lines, reduces the space occupied, has a simple structure and a reasonable layout, makes full use of the layout space, improves the space utilization rate, and is beneficial to improving the resolution and transparency.

In an exemplary embodiment, the first plate 41 has an elongated rectangular shape, and the first plate 41 completely covers the pixel driving circuit in each driving structure except for the position of the compensation connection line 51.

In an exemplary embodiment, the length of the first plate 41 in the second direction is greater than the distance between the gate electrode of the first transistor and the gate electrode of the third transistor formed subsequently, and the length of the first plate 41 in the second direction is greater than the distance between the first electrode of the first transistor and the first electrode of the third transistor formed subsequently, which can achieve effective shielding and prevent light from entering the active layers of all transistors.

As shown in FIGS. 1 and 3, in the four driving structures in the display area, the pixel driving circuit in each driving structure includes a first transistor T1, a second transistor T2, a third transistor T3 and a storage capacitor. The first transistor T1 includes a first active layer, a first gate electrode, a first source electrode and a first drain electrode; the second transistor T2 includes a second active layer, a second gate electrode, a second source electrode and a second drain electrode; and the third transistor T3 includes a third active layer, a third gate electrode, a third source electrode and a third drain electrode. The storage capacitor includes a first plate 41, a second plate 42 and a third plate 43. The first plate 41 and the second plate 42 form a first storage capacitor, and the second plate 42 and the third plate 43 form a second storage capacitor. The first plate 41 and the third plate 43 have the same potential, so the first storage capacitor and the second storage capacitor form a parallel structure, which effectively improves the storage capacity.

In an exemplary embodiment, the first scanning line Gn is connected with the first gate electrode of the first transistor T1 in each sub-pixel, the second scanning line Sn is connected with the third gate electrode of the third transistor T3 in each sub-pixel, the data line Dn is connected with the first source electrode of the first transistor T1 in each sub-pixel, the compensation connection line 51 is configured to connect the compensation line Se with the third source electrode of the third transistor T3 in each sub-pixel, and the power supply connection line 52 is configured to connect the first power supply line VDD with the second source electrode of the second transistor T2 in each sub-pixel. Taking a pixel driving circuit of a first sub-pixel P1 as an example, the first gate electrode of the first transistor T1 is connected with the first scanning line Gn, the first source electrode of the first transistor T1 is connected with the data line Dn, and the first drain electrode of the first transistor T1 is connected with the second gate electrode of the second transistor T2. The second gate electrode of the second transistor T2 is connected with the first drain electrode of the first transistor T1, the second source electrode of the second transistor T2 is connected with the first power supply line VDD through the power supply connection line 52, and the second drain electrode of the second transistor T2 is connected with the third drain electrode of the third transistor T3 and an anode of a light emitting element. The third gate electrode of the third transistor T3 is connected with the second scanning line Sn, the third source electrode of the third transistor T3 is connected with the compensation line Se through the compensation connection line 51, and the third drain electrode of the third transistor T3 is connected with the second drain electrode of the second transistor T2 and the anode of the light emitting element. The first plate 41 is connected with the second drain electrode of the second transistor T2 and the third drain electrode of the third transistor T3, the second plate 42 is connected with the first drain electrode of the first transistor T1 and the second gate electrode of the second transistor T2, and the third plate 43 is connected with the second drain electrode of the second transistor T2 and the third drain electrode of the third transistor T3.

In an exemplary embodiment, in the direction perpendicular to the display substrate, the driving structure layer includes a first metal layer, a first insulating layer, a metal oxide layer, a second insulating layer, a second metal layer, a third insulating layer, a third metal layer, a fourth insulating layer and a flat layer which are stacked.

The first metal layer includes the first plate 41 serving as a shielding layer and the compensation connection line 51. The first plate 41 serving as the shielding layer and the compensation connection line 51 are arranged on the same layer and formed by the same patterning process. The metal oxide layer includes the second plate 42 and the active layer of each transistor. The second plate 42 and the active layer of each transistor are arranged on the same layer and formed by the same patterning process. The second metal layer includes the first scanning line Gn, the second scanning line Sn, the power supply connection line 52 and the gate electrode of each transistor. The first scanning line Gn, the second scanning line Sn, the power supply connection line 52, and the gate electrode of each transistor are arranged on the same layer and formed by the same patterning process. The third metal layer includes the data line Dn, the compensation line Se, the first power supply line VDD, the second power supply line VSS, the third plate 43 and source and drain electrodes of each transistor. The data lines Dn, the first power supply line VDD, the second power supply line VSS, the compensation line Se, the third plate 43 and the source and drain electrodes of each transistor are arranged on the same layer and formed by the same patterning process. The flat layer is provided with via holes. The via hole V of the flat layer exposes the second electrode of the second transistor, and the first electrode in the light emitting structure layer is connected with the driving structure layer through the via hole of the flat layer.

In an exemplary embodiment, the first transistor T1 and the second transistor T2 are located on a side of the second plate 42 close to the first scanning line Gn, and the third transistor T3 is located on a side of the second plate 42 close to the second scanning line Sn.

In an exemplary embodiment, the second plate adopted a metal oxide material is used as a plate of the storage capacitor, the second plate forms storage capacitors with the first plate in the first metal layer and the third plate in the third metal layer respectively. The first plate and the third plate have the same potential, and the second plate has a different potential from the first plate and the third plate. Therefore, two parallel storage capacitors are formed between the first plate, the second plate and the third plate, which effectively increases the capacity of the storage capacitors and is beneficial to implementing high-resolution display. The preparation process of the present disclosure may be implemented by using the existing mature preparation equipment, has small improvements to the existing process, can be well compatible with the existing preparation process, is simple in process implementation, is easy to practice, and has high production efficiency, low production cost and high yield.

In an exemplary embodiment, the second plates in the second driving structure and the third driving structure are provided with openings. The opening of the second plate of the second driving structure is arranged on a side of the second driving structure close to the third driving structure, and the opening of the second plate of the third driving structure is arranged on a side of the third driving structure close to the second driving structure.

In an exemplary embodiment, the via holes of the flat layers in the first driving structure and the fourth driving structure are located between the third transistor and the second plate. The via holes of the flat layer in the first driving structure and the via hole of the flat layer in the fourth driving structure are mirror symmetric with respect to the compensation line. The via holes of the flat layer of the second driving structure is located in the opening of the second plate of the second driving structure, and the via holes of the flat layer of the third driving structure is located in the opening of the second plate of the third driving structure. The via holes of the flat layer in the second driving structure and the via holes of the flat layer in the third driving structure are mirror symmetric with respect to the compensation line.

In an exemplary embodiment, the included angle between the first direction and an arrangement direction of the via holes of the flat layer in the first driving structure and the via holes of the flat layer in the second driving structure is greater than 0 degree and smaller than 90 degrees.

In an exemplary embodiment, the first electrode of the first light emitting structure is connected with the first driving structure through the via hole of the flat layer in the first driving structure, the first electrode of the second light emitting structure is connected with the fourth driving structure through the via hole of the flat layer in the fourth driving structure, the first electrode of the third light emitting structure is connected with the second driving structure through the via hole of the flat layer in the second driving structure, and the first electrode of the fourth light emitting structure is connected with the third driving structure through the via hole of the flat layer in the third driving structure.

An opening area 711 of the pixel define layer of the first light emitting structure and an opening area 713 of the pixel define layer of the third light emitting structure are located between the second power supply line VSS and the compensation line Se, and there is an overlapping area between the orthographic projections of the opening area 711 of the pixel define layer of the first light emitting structure and the opening area 713 of the pixel define layer of the third light emitting structure on the substrate and the orthographic projections of the first driving structure and the second driving structure on the substrate.

An opening area 712 of the pixel define layer of the second light emitting structure and an opening area 714 of the pixel define layer of the fourth light emitting structure are located between the compensation line Se and the first power supply line VDD, and there is an overlapping area between the orthographic projections of the opening area 712 of the pixel define layer of the second light emitting structure and the opening area 714 of the pixel define layer of the fourth light emitting structure on the substrate and the orthographic projections of the third driving structure and the fourth driving structure on the substrate.

As shown in FIG. 1, there is no overlapping area between the orthographic projection of the via hole V of the flat layer of the first driving structure on the substrate and the orthographic projection of the opening area of the pixel define layer in the first light emitting structure on the substrate. There is no overlapping area between the orthographic projection of the via hole V of the flat layer of the second driving structure on the substrate and the orthographic projection of the opening area of the pixel define layer in the third light emitting structure on the substrate. There is no overlapping area between the orthographic projection of the via hole V of the flat layer of the third driving structure on the substrate and the orthographic projection of the opening area of the pixel define layer in the fourth light emitting structure on the substrate. There is no overlapping area between the orthographic projection of the via hole V of the flat layer of the fourth driving structure on the substrate and the orthographic projection of the opening area of the pixel define layer in the second light emitting structure on the substrate.

In an exemplary embodiment, the transparent area includes a first insulating layer, a third insulating layer, a fourth insulating layer and a flat layer which are stacked on the substrate.

In an exemplary embodiment, as shown in FIG. 1, the spacing area includes a first spacing area A1, a second spacing area A2 and a third spacing area. The first spacing area A1 is located between the opening area of the pixel define layer of the first light emitting structure and the opening area of the pixel define layer of the third light emitting structure. The second spacing area A2 is located between the opening area of the pixel define layer of the second light emitting structure and the opening area of the pixel define layer of the fourth light emitting structure. The first spacing area and the second spacing area are arranged in the first direction. The first spacing area and the second spacing area are located on the two sides of the third spacing area, respectively, and the orthographic projection of the third spacing area on the substrate coincides with the orthographic projection of the compensation line between the first scanning line and the second scanning line on the substrate.

In an exemplary embodiment, as shown in FIG. 1, the third spacing area includes: a first sub-spacing area A31, a second sub-spacing area A32 and a third sub-spacing area A33 which are sequentially arranged in the second direction and connected end to end. The second sub-spacing area A32 is located between the first sub-spacing area A31 and the third sub-spacing area A33.

The first sub-spacing area A31 is located between the opening area of the pixel define layer of the first light emitting structure and the opening area of the pixel define layer of the second light emitting structure. The third sub-spacing area A33 is located between the opening area of the pixel define layer of the third light emitting structure and the opening area of the pixel define layer of the fourth light emitting structure. The second sub-spacing area A32 is located between the first spacing area A1 and the second spacing area A2, and is arranged in the first direction with the first spacing area A1 and the second spacing area A2.

In an exemplary embodiment, as shown in FIG. 1, when the light filters are located on the first light emitting structure, the orthographic projection of the light filters on the substrate covers the orthographic projections of the opening area of the pixel define layer of the first light emitting structure, the first sub-spacing area and the second sub-spacing area on the substrate, and overlaps with the orthographic projections of partial second scanning lines and partial second power supply lines in the display area on the substrate.

In an exemplary embodiment, as shown in FIG. 1, when the light filters are located on the second light emitting structure, the orthographic projection of the light filters on the substrate covers the orthographic projections of the opening area of the pixel define layer of the second light emitting structure, the second spacing area, the first sub-spacing area and the second sub-spacing area on the substrate, and overlaps with the orthographic projections of partial second scanning lines and partial first power supply lines in the display area on the substrate.

In an exemplary embodiment, as shown in FIG. 1, when the light filters are located on the third light emitting structure, the orthographic projection of the light filters on the substrate covers the orthographic projection of the opening area of the pixel define layer of the third light emitting structure on the substrate, and overlaps with the orthographic projections of partial first spacing area, partial third sub-spacing area, and partial first scanning lines and partial second power supply lines in the display area on the substrate.

In an exemplary embodiment, as shown in FIG. 1, when the light filters are located on the fourth light emitting structure, the orthographic projection of the light filters on the substrate covers the orthographic projection of the opening area of the pixel define layer of the fourth light emitting structure on the substrate, and overlaps with the orthographic projections of partial second spacing area, partial third sub-spacing area, and partial first scanning lines and partial first power supply lines in the display area on the substrate.

In an exemplary embodiment, as shown in FIG. 1B, there is no overlapping area between the orthographic projection of the color filter layer on the substrate and the orthographic projection of the via hole of the flat layer in the driving structure layer on the substrate, which can ensure that the overlapping area between adjacent light filters is reduced, so as to reduce cross color.

In an exemplary embodiment, as shown in FIGS. 1A and 1B, the display substrate further includes a shielding layer 30. There is an overlapping area between the orthographic projection of the shielding layer 30 on the substrate and the orthographic projections of the first scanning line Gn in the transparent area and the second scanning line Sn in the transparent area and part of the display area on the substrate.

In an exemplary embodiment, the shielding layer 30 includes a first shielding layer 301 and a second shielding layer 302. The first shielding layer 301 is located on a side of the second shielding layer 302 close to the substrate. The first shielding layer 301 is arranged on the same layer as the light filters of one color among the plurality of light filters, and the second shielding layer 302 is arranged on the same layer as the light filters of another color among the plurality of light filters, thereby simplifying the manufacturing process of the display substrate.

Next, the structure of the display substrate according to an exemplary embodiment will be described through a preparation process of the display substrate. The "patterning process" includes the treatments, such as film layer deposition, photoresist coating, mask exposure, development, etching, and photoresist stripping. Deposition may be implemented by any one or more of sputtering, evaporation and chemical vapor deposition, coating may be implemented by any one or more of spraying and spin coating, and etching may be implemented by any one or more of dry etching and wet etching. "Thin film" refers to a layer of thin film fabricated by using a deposition or coating process to process a certain material on a substrate. If the "thin film" does not require a patterning process during the whole fabrication process, the "thin film" can also be called a "layer". If the "thin film" requires a patterning process throughout the whole fabrication process, it is referred to as a "thin film" before the patterning process and as a "layer" after the patterning process. In the present disclosure, "A and B being arranged on a same layer" means that A and B are formed at the same time by the same patterning process.

FIGS. 5-15 are schematic diagrams of the preparation process of a display substrate according to an exemplary embodiment, illustrating a layout structure of a display unit of an OLED display substrate, each display unit including a display area 100 and a transparent area 200, a driving structure layer of the display area 100 including four driving structures P1 to P4, and a pixel driving circuit of each driving structure including a first transistor T1, a second transistor T2, a third transistor T3 and a storage capacitor.

Figure 5A:
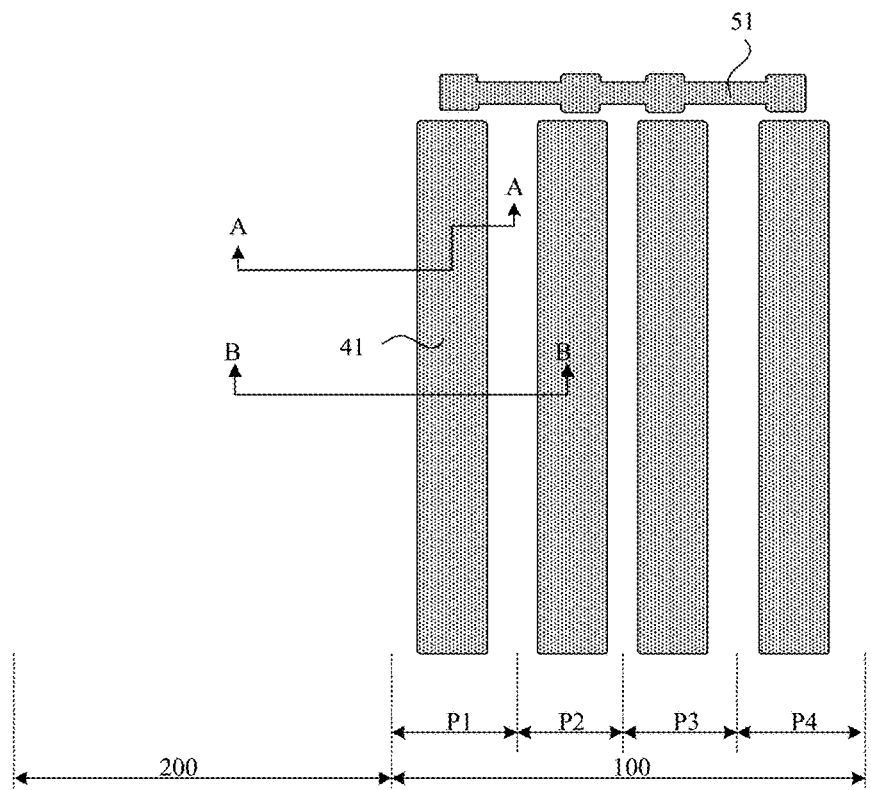
FIG. 5A is a schematic diagram after a first metal layer is formed.
Figure 5B:
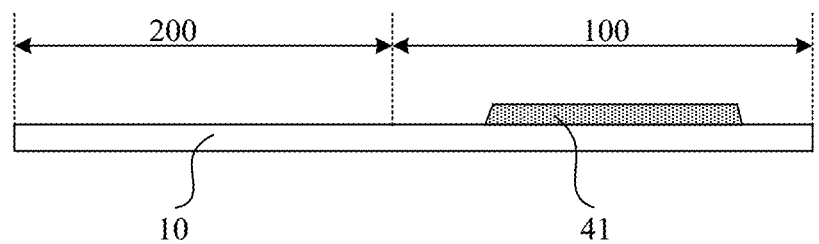
FIG. 5B is a sectional view of FIG. 5A in an A-A direction.
Figure 5C:
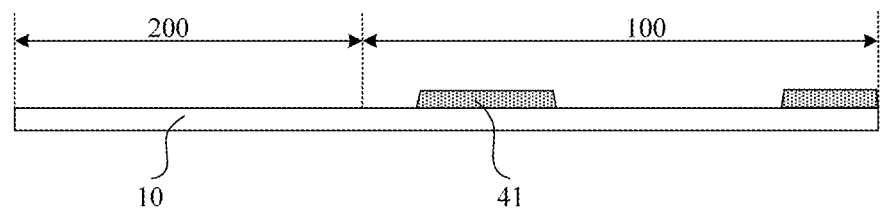
FIG. 5C is a sectional view of FIG. 5A in a B-B direction.

(1) Forming a first metal layer, which includes: depositing a first metal thin film on a substrate, and patterning the first metal thin film by a patterning process to form on the substrate 10 a first metal layer which is located in the display area 100. The first metal layer includes a first plate 41 and a compensation connection line 51, and each driving structure is formed with a first plate 41, as shown in FIG. 5, wherein FIG. 5B is a sectional view of FIG. 5A in an A-A direction, and FIG. 5C is a sectional view of FIG. 5A in a B-B direction.

In an exemplary embodiment, the first plate 41 serves as a plate of a first storage capacitor, for forming the first storage capacitor with a second plate formed subsequently, and also serves as a shielding layer and is configured to shield the active layers of the transistors from light to reduce the intensity of light irradiated onto the transistor and reduce leakage current, thereby reducing the influence of light irradiation on the properties of the transistors.

In an exemplary embodiment, the compensation connection line 51 is a stripe-shaped structure spanning 4 sub-pixels. The compensation connection line 51 is configured to be connected with the compensation line formed subsequently, to enable the compensation line to provide a compensation signal to the driving structure.

In an exemplary embodiment, the first metal layer in the first driving structure P1 and the first metal layer in the fourth driving structure P4 are mirror symmetric with respect to a vertical axis, and the first metal layer in the second driving structure P2 and the first metal layer in the third driving structure P3 are mirror symmetric with respect to the vertical axis. The vertical axis is a center line of the second driving structure and the third driving structure.

Figure 6A:
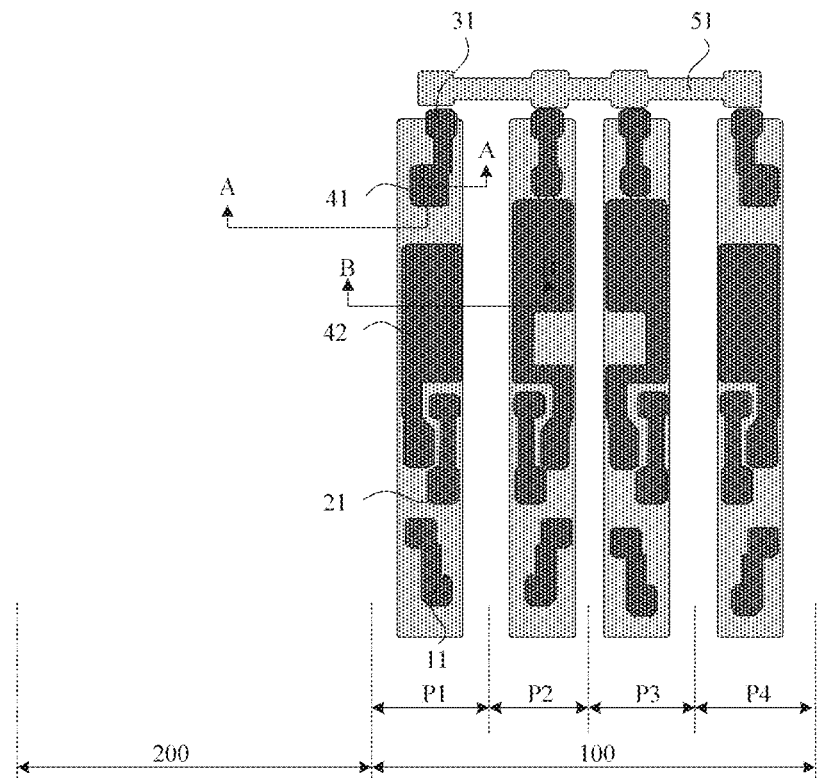
FIG. 6A is a schematic diagram after a metal oxide layer is formed.
Figure 6B:
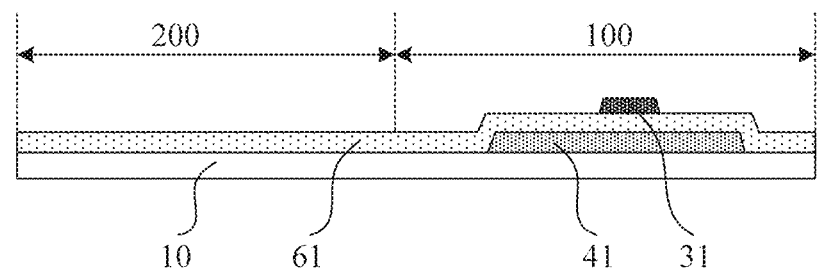
FIG. 6B is a sectional view of FIG. 6A in an A-A direction.
Figure 6C:
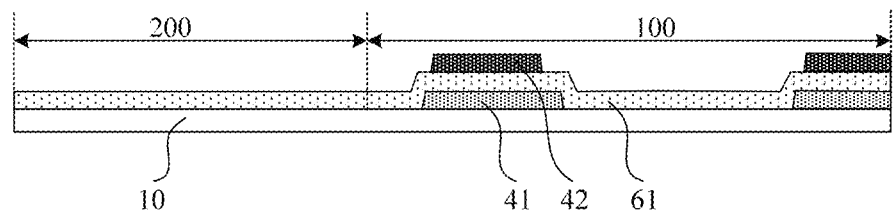
FIG. 6C is a sectional view of FIG. 6A in a B-B direction.

(2) Forming a metal oxide layer, which includes: depositing a first insulating thin film on the substrate on which the first metal layer is formed, patterning the first insulating thin film by a patterning process to form a first insulating layer 61 which covers the first metal layer and is located in the display area and the transparent area, depositing a metal oxide thin film on the first insulating layer 61, and patterning the metal oxide thin film by a patterning process to form a metal oxide layer located in the display area. The metal oxide layer includes a first active layer 11, a second active layer 21, a third active layer 31 and one second plate 42 which are arranged in each driving structure. As shown in FIG. 6, FIG. 6B is a sectional view of FIG. 6A in an A-A direction, and FIG. 6C is a sectional view of FIG. 6A in a B-B direction.

The first active layer 11 serves as the active layer of the first transistor, the second active layer 21 serves as the active layer of the second transistor, and the third active layer 31 serves as the active layer of the third transistor. There is an overlapping area between the orthographic projection of the second plate 42 on the substrate 10 and the orthographic projection of the first plate 41 on the substrate 10, and the first plate 41 and the second plate 42 form a first storage capacitor. The second plate 42 not only serves as a plate of the first storage capacitor, but also serves as a plate of a second storage capacitor. The second plate 42 is configured to form the second storage capacitor with the third plate formed subsequently.

In an exemplary embodiment, there is an overlapping area between the orthographic projections of the first active layer 11, the second active layer 21 and the third active layer 31 on the substrate 10 and the orthographic projection of the first plate 41 on the substrate 10, so that the first plate 41 serving as the shielding layer can shield channel regions of the first transistor, the second transistor and the third transistor to prevent light from affecting the channels so as to prevent the channels from generating photo-generated leakage to affect the display effect. The orthographic projections of the first active layer 11, the second active layer 21 and the third active layer 31 on the substrate 10 are spaced apart from the orthographic projection of the second plate 42 on the substrate 10. That is, there is no overlapping area between the first active layer 11 and the second plate 42, between the second active layer 21 and the second plate 42, and between the third active layer 31 and the second plate 42, which is beneficial to designing the width-length ratio of the channels of the first transistor, the second transistor and the third transistor according to relevant requirements.

The third active layer 31 is located on a side of the second plate 42 close to the compensation connection line 51, the first active layer 11 and the second active layer 21 are located on a side of the second plate 42 away from the compensation connection line 51, and the second active layer 21 is located on a side of the first active layer 11 close to the compensation connection line 51.

In an exemplary embodiment, the metal oxide layer in the first driving structure P1 and the metal oxide layer in the fourth driving structure P4 are mirror symmetric with respect to the vertical axis, and the metal oxide layer in the second driving structure P2 and the metal oxide layer in the third driving structure P3 are mirror symmetric with respect to the vertical axis. There is a spacing between the third active layer 31 and the second plates 42 in the first driving structure P1 and the fourth driving structure P4, and an opening is provided in the middle of the second plates 42 of the second driving structure P2 and the third driving structure P3.

Figure 7A:
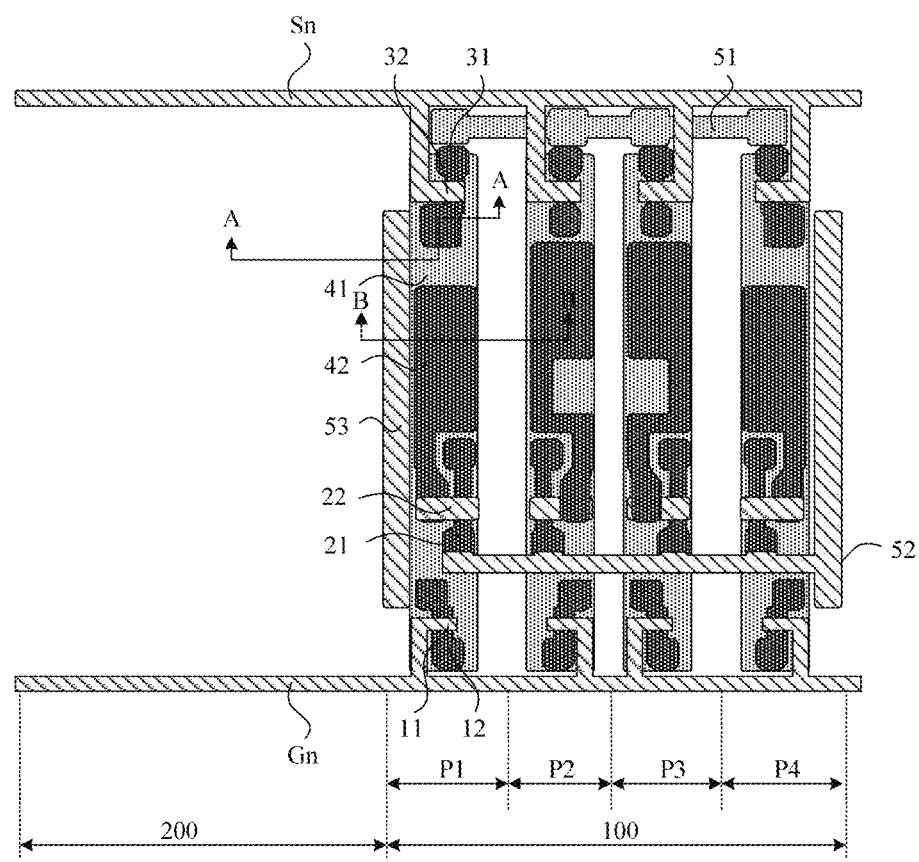
FIG. 7A is a schematic diagram after a second metal layer is formed.
Figure 7B:
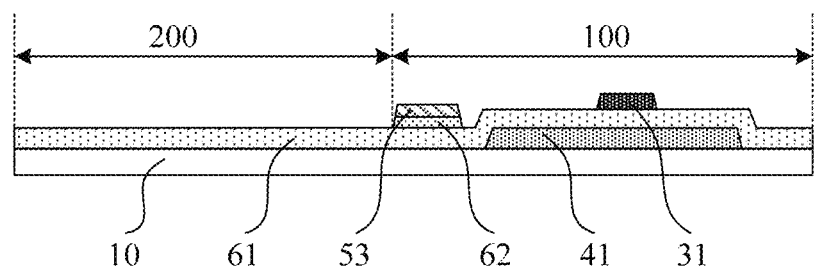
FIG. 7B is a sectional view of FIG. 7A in an A-A direction.
Figure 7C:
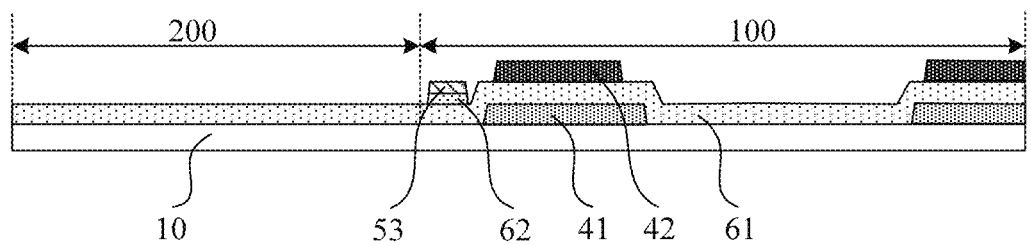
FIG. 7C is a sectional view of FIG. 7A in a B-B direction.

(3) Forming a second metal layer, which includes: depositing a second insulating thin film on the substrate on which the metal oxide layer is formed, patterning the second insulating thin film by a patterning process to form a second insulating layer 62 located in the display area, depositing a second metal thin film on the second insulating layer 62, and patterning the second metal thin film by a patterning process to form a second metal layer. The second metal layer includes a first scanning line Gn, a second scanning line Sn, a power supply connection line 52 and an auxiliary power supply line 53 formed in each display unit, and a first gate electrode 12, a second gate electrode 22 and a third gate electrode 32 formed in each driving structure, as shown in FIG. 7A, FIG. 7B is a sectional view of FIG. 7A in an A-A direction, and FIG. 7C is a sectional view of FIG. 7A in a B-B direction.

In an exemplary embodiment, the first scanning line Gn and the second scanning line Sn are arranged in parallel and both extend in the first direction. The first scanning line Gn and the second scanning line Sn are located on the two sides of the driving structure layer. The first scanning line Gn is arranged on a side of the driving structure layer close to the first transistor, and the second scanning line Sn is located on a side of the driving structure layer close to the third transistor.

In an exemplary embodiment, the first gate electrode 12 is an integral structure with the first scanning line Gn being connected to and spans the first active layer 11. The second gate electrode 22 spans the second active layer 21 and the second plate 42. The third gate electrode 32 is connected with the second scanning line Sn to form an integral structure and spans the third active layer 31.

In an exemplary embodiment, the power supply connection line 52 includes a first connection strip perpendicular to the first scanning line Gn and a second connection strip parallel to the first scanning line Gn. One end of the first connection strip and one end of the second connection strip are connected with each other. The first connecting strip is formed in an area where the first power supply line VDD is located in the display unit, and is configured to be connected with the first power supply line VDD formed subsequently. The second connection strip spans the four driving structures and is configured to provide a high-level signal to each driving structure.

In an exemplary embodiment, the auxiliary power supply line 53 is formed in an area where the second power supply line VSS is located in the display unit, is perpendicular to the first scanning line Gn, and is configured to be connected with the second power supply line VSS formed subsequently.

In an exemplary embodiment, the second insulating layer 62 is the same as the second metal layer. That is, the second insulating layer 62 is located below the second metal layer, and there is no second insulating layer 62 in an area outside the second metal layer.

In an exemplary embodiment, the second metal layer in the first driving structure P1 and the second metal layer in the fourth driving structure P4 are mirror symmetric with respect to the vertical axis, and the second metal layer in the second driving structure P2 and the second metal layer in the third driving structure P3 are mirror symmetric with respect to the vertical axis.

In an exemplary embodiment, this process further includes a conduction treatment. Conduction treatment is to perform plasma treatment on the metal oxide layer by using the first gate electrode 12, the second gate electrode 22 and the third gate electrode 32 as a shield after the formation of the second metal layer. The metal oxide layer in an area shielded by the first gate electrode 12, the second gate electrode 22 and the third gate electrode 32 (i.e., an area of the metal oxide layer overlapping with the first gate electrode 12, the second gate electrode 22 and the third gate electrode) serves as channel regions of the transistors, and the metal oxide layer in an area not shielded by the second metal layer is treated into a conductive layer to form a conductive second plate 42 and conductive source and drain regions.

Figure 8A:
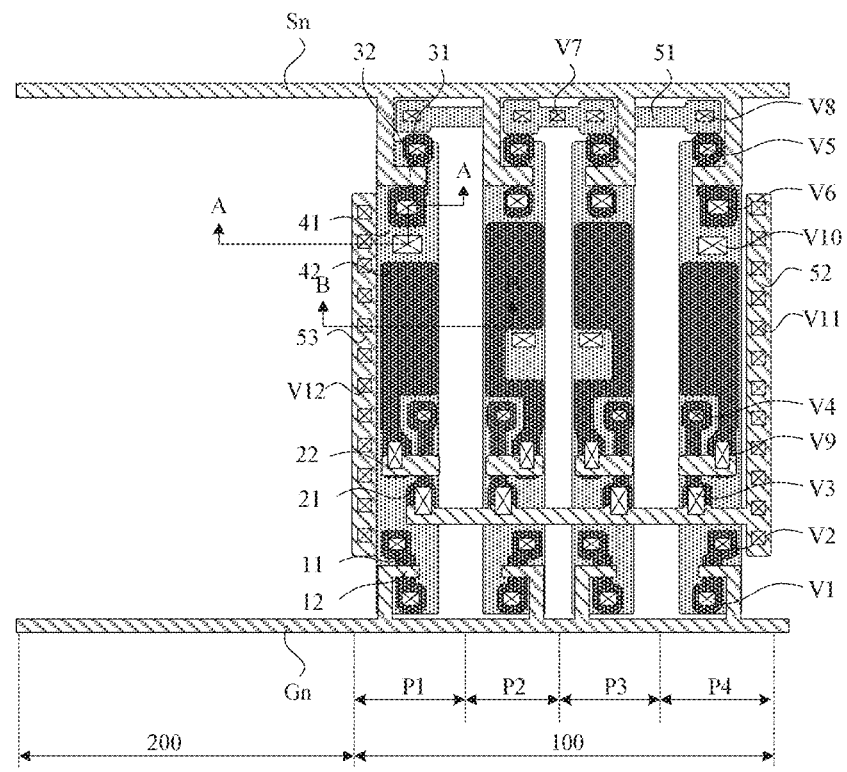
FIG. 8A is a schematic diagram of a third insulating layer being formed.
Figure 8B:
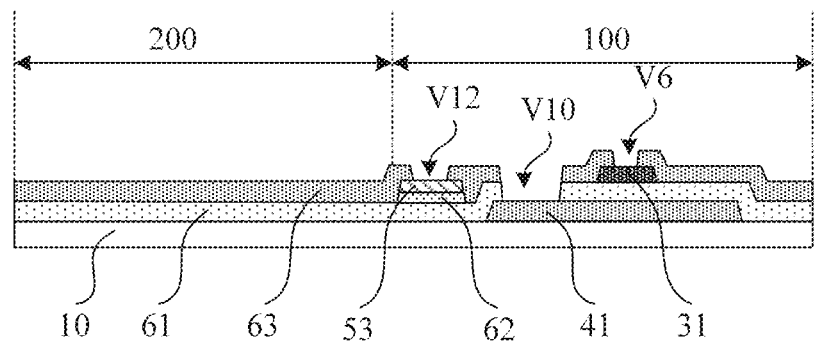
FIG. 8B is a sectional view of FIG. 8A in an A-A direction.
Figure 8C:
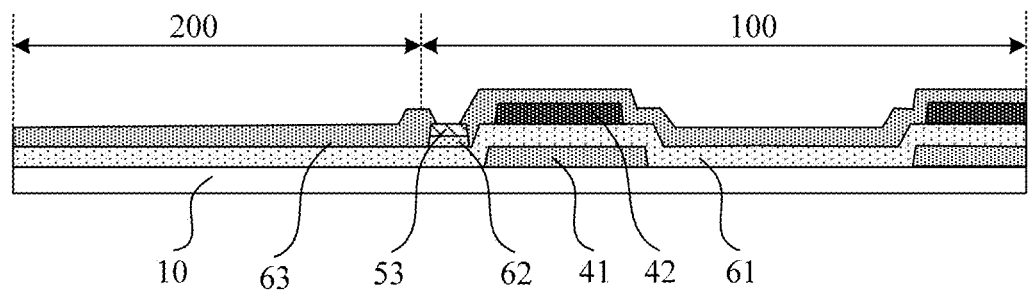
FIG. 8C is a sectional view of FIG. 8A in a B-B direction.

(4) Forming a third insulating layer, which includes: depositing a third insulating thin film on the substrate on which the second metal layer is formed, patterning the third insulating thin film by a patterning process to form a third insulating layer 63 located in the display area and the transparent area. The third insulating layer 63 is provided with a plurality of via holes, including: a first via hole V1 and a second via hole V2 located on the two sides of the first gate electrode 12, a third via hole V3 and a fourth via hole V4 located on the two sides of the second gate electrode 22, a fifth via hole V5 and a sixth via hole V6 located on the two sides of the third gate electrode 32, a seventh via hole V7 and an eighth via hole V8 located at the position of the compensation connection line 51, a ninth via hole V9 located in the overlapping area between the second gate electrode 22 and the second plate 42, a tenth via hole V10 located at the position of the first plate 41, a plurality of eleventh via holes V11 located at the position of the first connection strip of the power supply connection line 52, and a plurality of twelfth via holes V12 located at the position of the auxiliary power supply line 53, as shown in FIG. 8A, FIG. 8B is a sectional view of FIG. 8A in an A-A direction, and FIG. 8C is a sectional view of FIG. 8A in a B-B direction.

In an exemplary embodiment, the first via hole V1 and the second via hole V2 expose surfaces at both ends of the first active layer 11. The third via hole V3 is a transfer via hole consisting of two half holes, with one half hole being formed on the second active layer 21 and the other half hole being formed on the second connection strip of the power supply connection line 52. The transfer via hole formed by the two half holes exposes the surface of the second active layer 21 and the surface of the second connection strip of the power supply connection line 52 simultaneously. The fourth via hole V4 exposes the surface of the second active layer 21. The fifth via hole V5 and the sixth via hole V6 expose surfaces at both ends of the third active layer 31. The seventh via hole V7 is located at a position where the compensation connection line 51 overlaps with the compensation line formed subsequently. Each driving structure is formed with an eighth via hole V8. The seventh via hole V7 and the eighth via hole V8 expose the surface of the compensation connection line 51. The ninth via hole V9 is a transfer via hole consisting of two half holes, with one half hole being formed on the second gate electrode 22 and the other half hole being formed on the second plate 42. The transfer via hole formed by the two half holes exposes the surface of the second gate electrode 22 and the surface of the second plate 42 simultaneously. The tenth via hole V10 exposes the surface of the first plate 41. The eleventh via hole V11 is located at a position of the first connection strip of the power supply connection line 52. The plurality of eleventh via holes V11 are arranged at intervals, and the eleventh via holes V11 expose the surface of the first connection strip of the power supply connection line 52. The twelfth via hole V12 is located at the position of the auxiliary power supply line 53. The plurality of twelfth via holes V12 are arranged at intervals, and the third insulating layer 63 in the twelfth via holes V12 exposes the surface of the auxiliary power supply line 53.

In an exemplary embodiment, the tenth via holes V10 in the first driving structure P1 and the fourth driving structure P4 are located in the spacing between the second plate 42 and the third active layer 31. The tenth via holes V10 in the second driving structure P2 and the third driving structure P3 are located in the opening in the middle of the second plate 42.

Figure 9A:
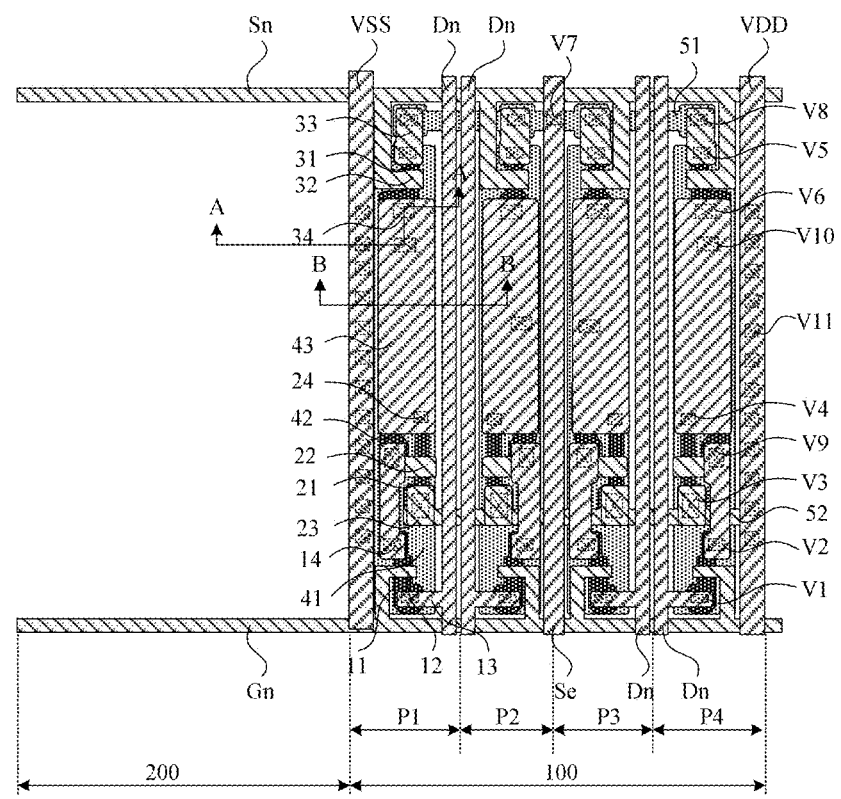
FIG. 9A is a schematic diagram of a third metal layer being formed.
Figure 9B:
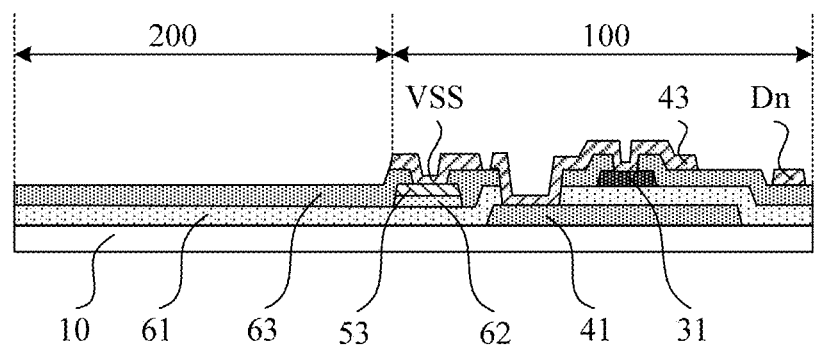
FIG. 9B is a sectional view of FIG. 9A in an A-A direction.
Figure 9C:
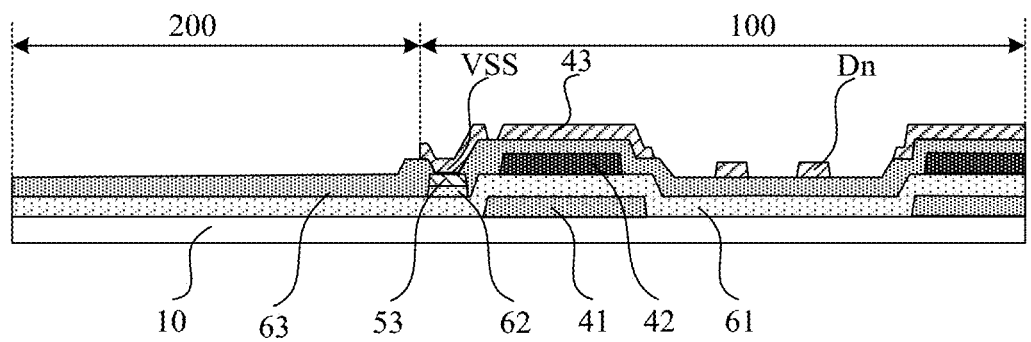
FIG. 9C is a sectional view of FIG. 9A in a B-B direction.

(5) Forming a third metal layer, which includes: depositing a third metal thin film on the substrate on which the third insulating layer is formed, patterning the third metal thin film by a patterning process to form on the third insulating layer 63 a third metal layer located in the display area 100. The third metal layer includes: one first power supply line VDD, one second power supply line VSS, one compensation line Se and four data lines Dn formed in each display unit, and a first source electrode 13, a first drain electrode 14, a second source electrode 23, a second drain electrode 24, a third source electrode 33, a third drain electrode 34 and a third plate 43 formed in each driving structure. As shown in FIG. 9A, FIG. 9B is a sectional view of FIG. 9A in an A-A direction, and FIG. 9C is a sectional view of FIG. 9A in a B-B direction.

In an exemplary embodiment, the first power supply line VDD, the second power supply line VSS, the compensation line Se and the data lines Dn are arranged in parallel and extend in the second direction. The second power supply line VSS is arranged on a side of the first driving structure P1 close to the transparent area 200, and the first power supply line VDD is arranged on a side of the fourth driving structure away from the transparent area 200. The compensation line Se is arranged between the first power supply line VDD and the second power supply line VSS and between the second driving structure P2 and the third driving structure P3. Two data lines Dn are arranged between the second power supply line VSS and the compensation line Se, and between the first driving structure P1 and the second driving structure P2. The other two data lines Dn are arranged between the first power supply line VDD and the compensation line Se, and between the third driving structure P3 and the fourth driving structure P4.

In an exemplary embodiment, the first power supply line VDD is connected with the power supply connection line 52 through a plurality of eleventh via holes V11, so that the first power supply line VDD is respectively connected with the second source electrode 23 of each driving structure through the power supply connection line 52. The second power supply line VSS is connected with the auxiliary power supply line 53 through a plurality of twelfth via holes V12, so that the second power supply line VSS outputs a low-level signal to the cathode of the light emitting element of each sub-pixel through the auxiliary power supply line 53. The compensation line Se is connected with the compensation connection line 51 through the seventh via hole V7, so that the compensation line Se is respectively connected with the third source electrode 33 of each driving structure through the compensation connection line 51. The compensation line Se is arranged in the middle of the display area 100, and is connected with the third transistors of the driving structures on both sides of the display area through the compensation connection line 51, and the third transistors of the driving structures on the left and right sides are symmetrically arranged with respect to the compensation line Se. This symmetrical design enables each display unit to use only one compensation line Se, which can ensure that the compensation signals substantially have the same RC delay before being written into the transistors, thus ensuring display uniformity.

In an exemplary embodiment, the first source electrode 13 is an integral structure with the data line Dn being connected to, so that each data line Dn is connected with the first source electrode 13 of the driving structure in which the data line Dn is located. The first source electrode 13 is connected with one end of the first active layer 11 through the first via hole V1, the first drain electrode 14 is connected with the other end of the first active layer 11 through the second via hole V2, and the first drain electrode 14 is simultaneously connected with the second gate electrode 22 and the second plate 42 through the ninth via hole V9 having a transfer structure, thus enabling the first drain electrode 14, the second gate electrode 22 and the second plate 42 to have the same potential.

In an exemplary embodiment, the second source electrode 23 is simultaneously connected with the power supply connection line 52 and one end of the second active layer 21 through the third via hole V3 having a transfer structure, thus implementing the connection between the second source electrode 23 and the first power supply line VDD. The second drain electrode 24 is connected with the other end of the second active layer 21 through the fourth via hole V4.

In an exemplary embodiment, the third source electrode 33 is connected with one end of the third active layer 31 through the fifth via hole V5 and connected with the compensation connection line 51 through the eighth via hole V8, thus implementing the connection between the third source electrode 33 and the compensation line Se. The third drain electrode 34 is connected with the other end of the third active layer 31 through the sixth via hole V6.

In an exemplary embodiment, the second drain electrode 24, the third drain electrode 34 and the third plate 43 are an integrated structure in which they are connected with each other. The third plate 43 is connected with the first plate 41 through the tenth via hole V10. Therefore, the second drain electrode 24 is simultaneously connected with the first plate 41 and the third plate 43, and the third drain electrode 34 is simultaneously connected with the first plate 41 and the third plate 43, thus enabling the second drain electrode 24, the third drain electrode 34, the first plate 41 and the third plate 43 to have the same potential.

In an exemplary embodiment, there is an overlapping area between the orthographic projection of the third plate 43 on the substrate 10 and the orthographic projection of the second plate 42 on the substrate 10, and the third plate 43 and the second plate 42 form a second storage capacitor.

In an exemplary embodiment, the third metal layer in the first driving structure P1 and the third metal layer in the fourth driving structure P4 are mirror symmetric with respect to the vertical axis, and the third metal layer in the second driving structure P2 and the third metal layer in the third driving structure P3 are mirror symmetric with respect to the vertical axis.

After this patterning process, the third metal layer is formed in the display area 100, and the transparent area 200 includes the first insulating layer 61 and the third insulating layer 63 stacked on the substrate 10.

Figure 10A:
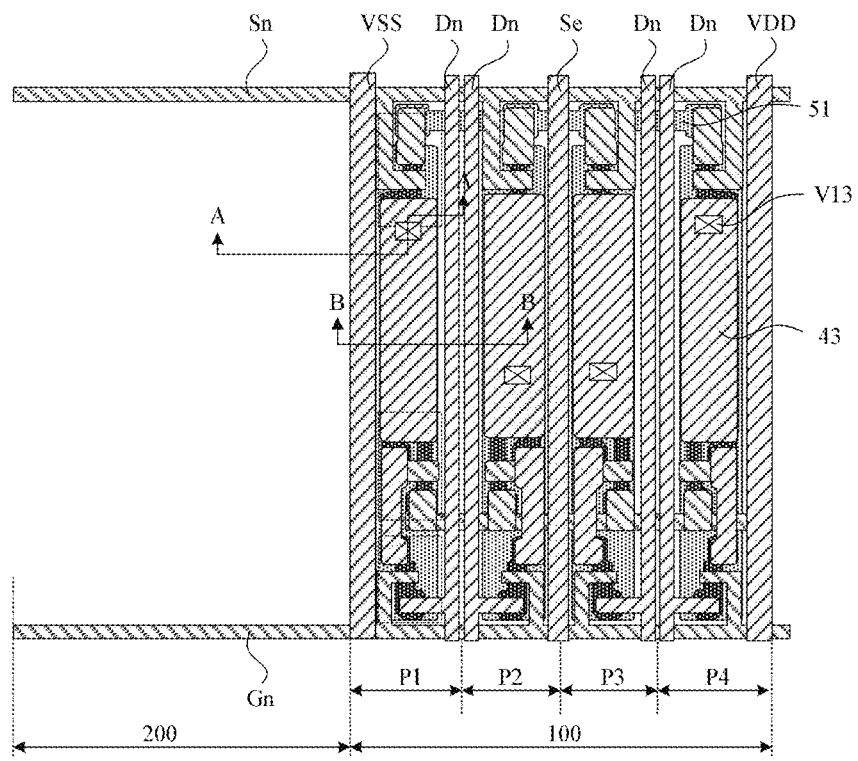
FIG. 10A is a schematic diagram after a fourth insulating layer and a flat layer are formed.
Figure 10B:
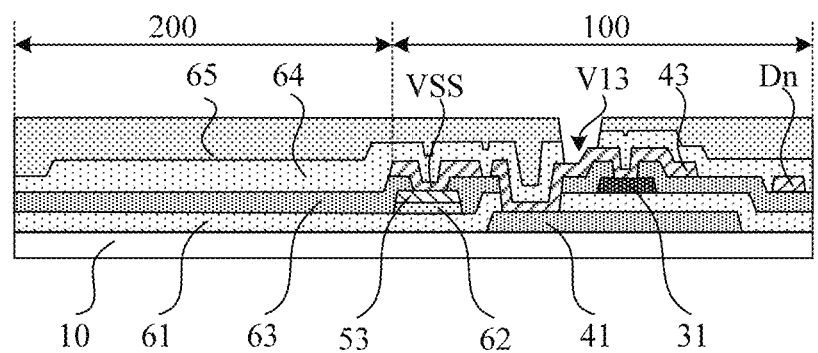
FIG. 10B is a sectional view of FIG. 10A in an A-A direction.
Figure 10C:
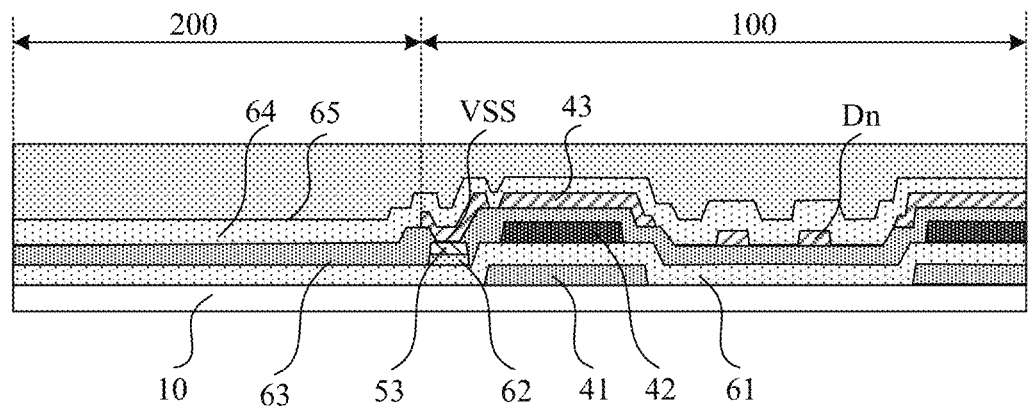
FIG. 10C is a sectional view of FIG. 10A in a B-B direction.

(6) Forming a fourth insulating layer and a flat layer, which includes: first depositing a fourth insulating thin film on the substrate on which the third metal layer is formed, then coating a flat thin film, and etching the fourth insulating thin film through masking, exposure and development of the flat thin film to form a fourth insulating layer 64 located in the display area and the transparent area, and a flat layer 65 that is arranged on the fourth insulating layer 64 and located in the display area and the transparent area. The fourth insulating layer 64 and the flat layer 65 are provided with a plurality of via holes, including: a thirteenth via hole V13 at the position of the drain electrode of the second transistor T2 in each driving structure, as shown in FIG. 10, wherein FIG. 10B is a sectional view of FIG. 10A in an A-A direction, and FIG. 10C is a sectional view of FIG. 10A in a B-B direction. The fourth insulating layer 64 and the flat layer 65 in the thirteenth via hole V13 expose the surface of the drain electrode of the second transistor T2.

The thirteenth via hole V13 is the same via hole as the via hole V of the flat layer in FIG. 1.

Figure 11A:
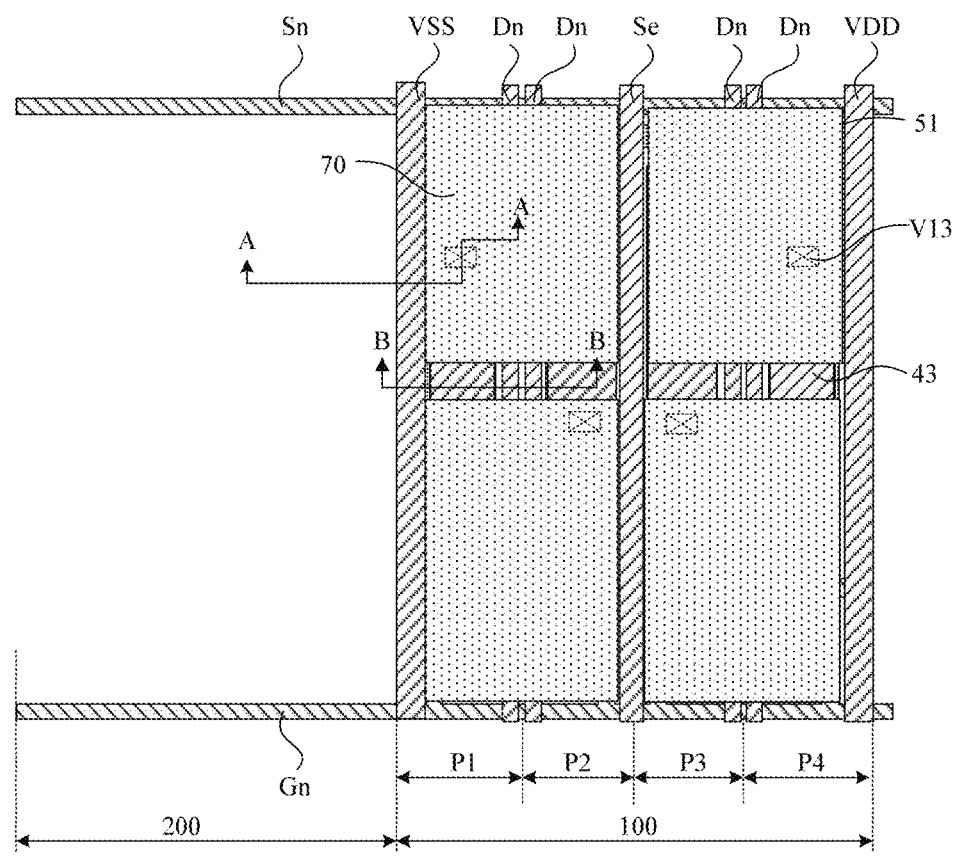
FIG. 11A is a schematic diagram after a transparent conductive layer is formed in the present disclosure.
Figure 11B:
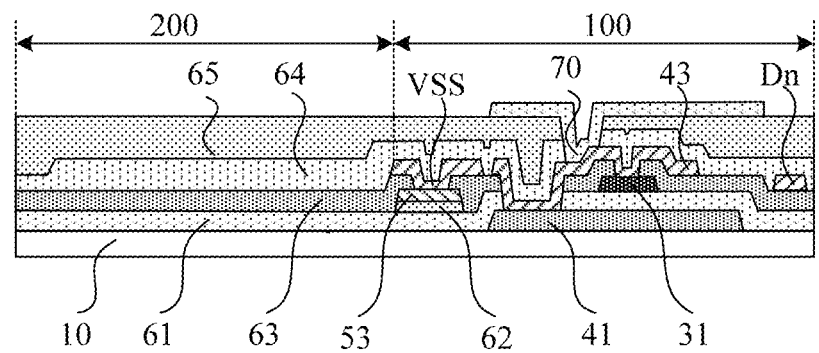
FIG. 11B is a sectional view of FIG. 11A in an A-A direction.
Figure 15:
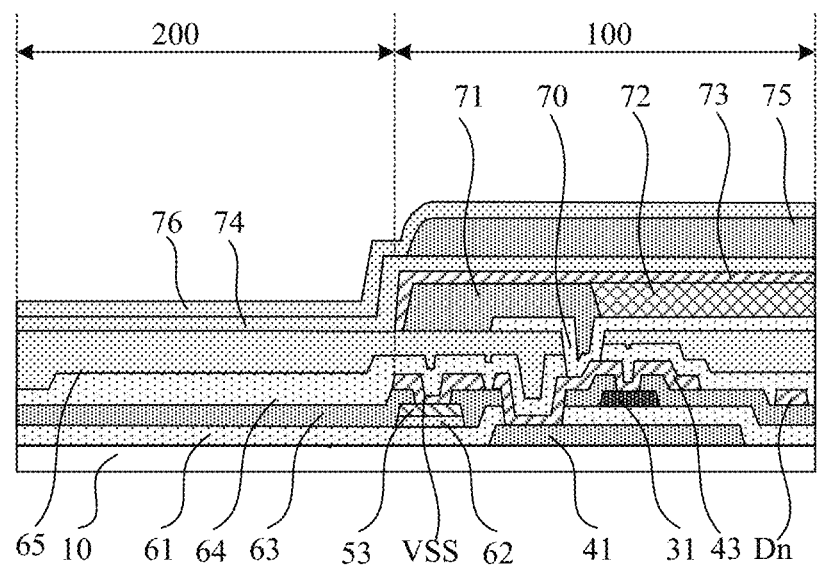
FIG. 15 is a schematic diagram after an encapsulation layer is formed.

(7) Forming a transparent conductive layer, which includes: depositing a transparent conductive thin film on the substrate on which the flat layer is formed, and patterning the transparent conductive thin film by a patterning process to form a transparent conductive layer on the flat layer 65. The transparent conductive layer includes an anode 70 formed in each light emitting structure in the display area 100, and the anode 70 is connected with the second electrode of the second transistor T2 through the thirteenth via hole V13, as shown in FIG. 15. Since the second electrode of the second transistor T2, the first electrode of the third transistor T3 and the third plate 43 are an integrated structure in which they are connected with each other, the thirteenth via hole V13 can be arranged at any position of the third plate 43, as shown in FIG. 11, wherein FIG. 11B is a sectional view of FIG. 11A in an A-A direction, and the sectional view in the B-B direction in FIG. 11A is the same as FIG. 10C.

Figure 12A:
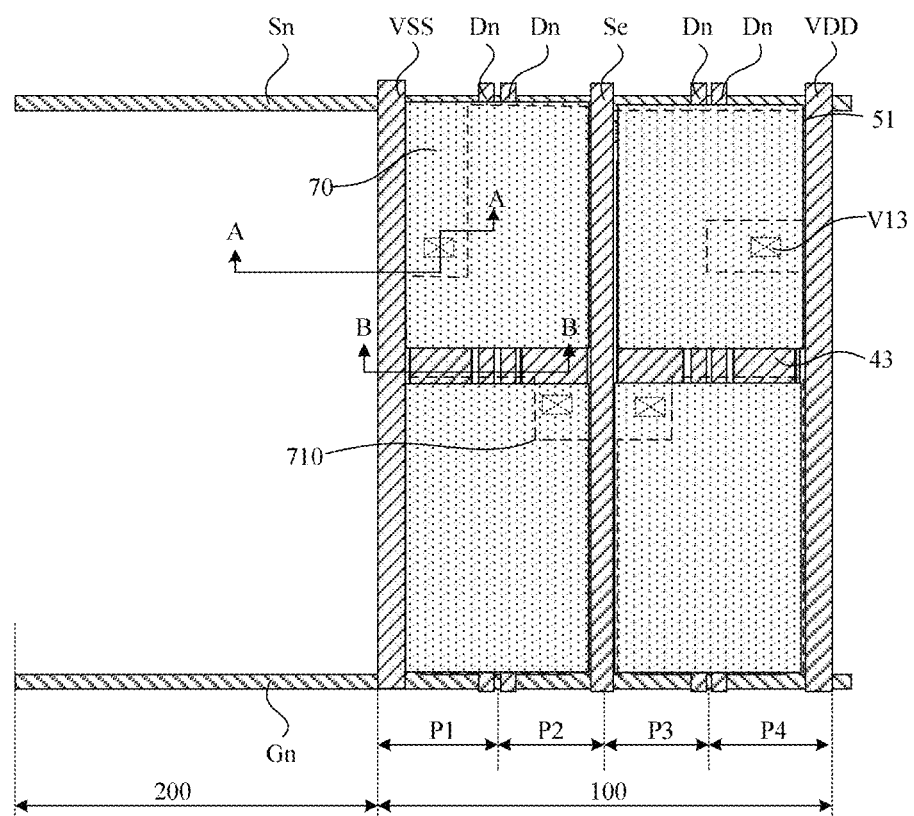
FIG. 12A is a schematic diagram after a pixel define layer is formed.
Figure 12B:
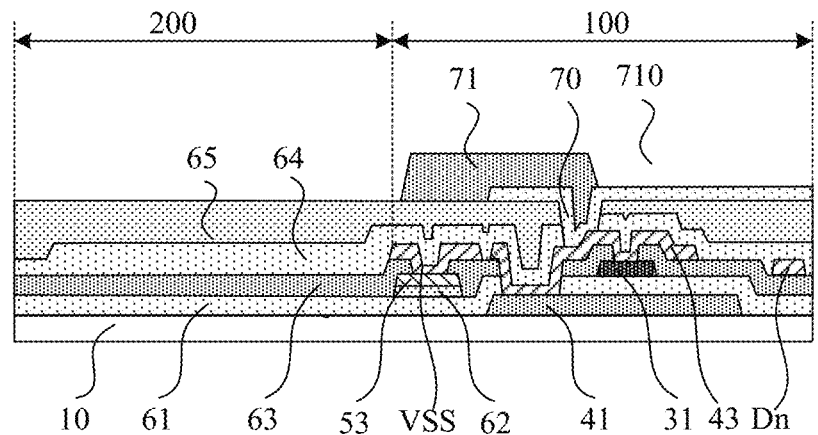
FIG. 12B is a sectional view of FIG. 12A in an A-A direction.
Figure 12C:
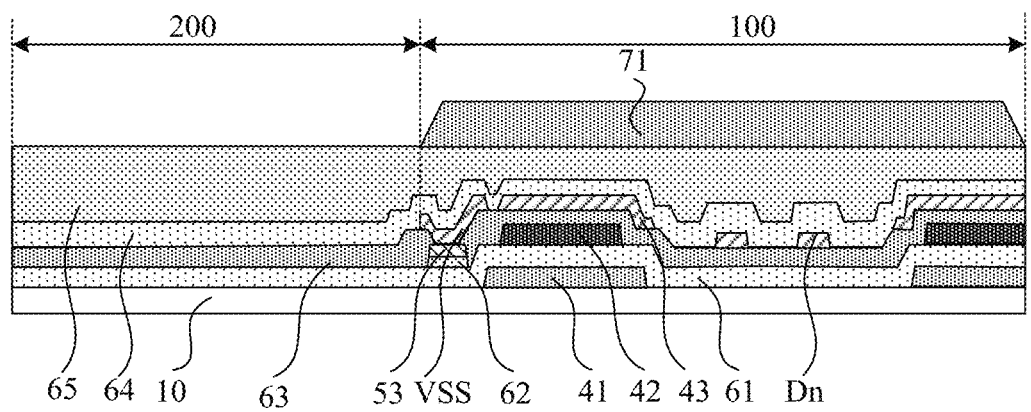
FIG. 12C is a sectional view of FIG. 12A in a B-B direction.

(8) Forming a pixel define layer, which includes: coating a pixel definition thin film onto the substrate on which the transparent conductive layer is formed, and forming a pixel define layer through masking, exposure and development processes. The pixel define layer is formed in each light emitting structure in the display area 100, and the pixel define layer in each light emitting structure is formed with an opening area 710 exposing the anode 70, as shown in FIG. 12, wherein FIG. 12B is a sectional view of FIG. 12A in an A-A direction, and FIG. 12C is a sectional view of FIG. 12A in a B-B direction.

Figure 13:
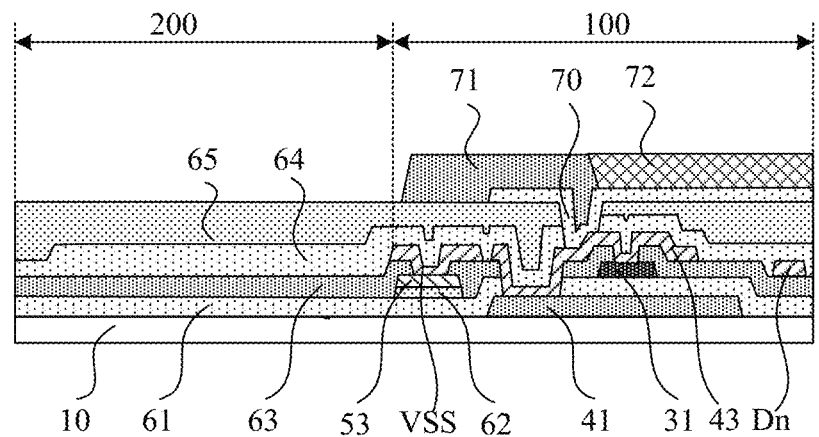
FIG. 13 is a schematic diagram after an organic light emitting layer is formed.

(9) Forming an organic light emitting layer, which includes: forming an organic light emitting layer 71 in the opening area of the pixel define layer formed and on the pixel define layer, the organic light emitting layer 71 being connected with the anode 70, as shown in FIG. 13.

Figure 14A:
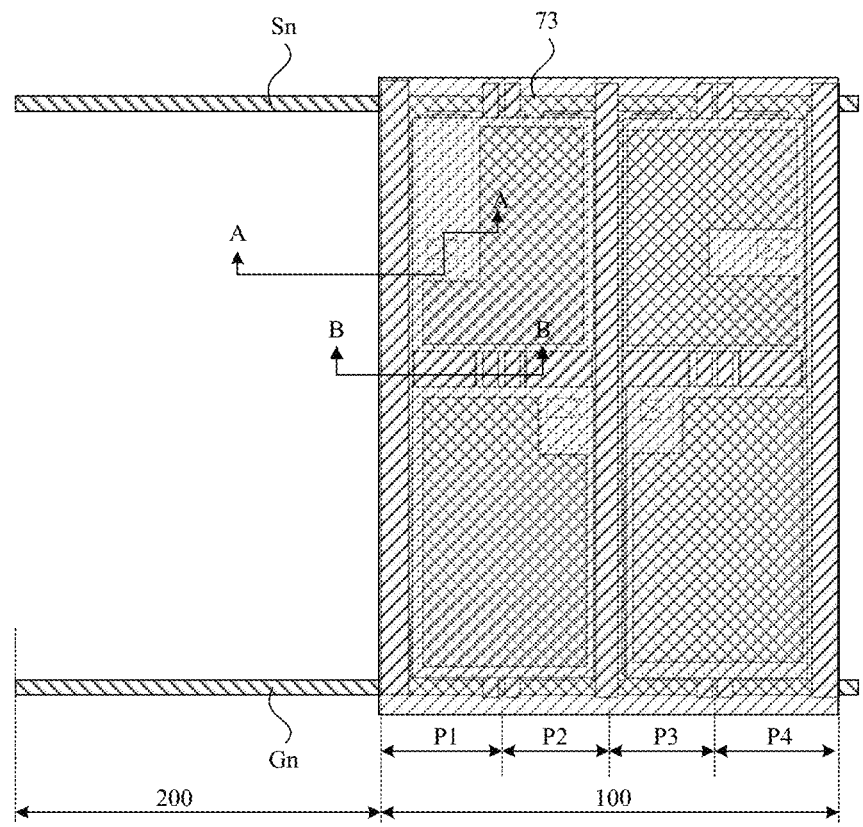
FIG. 14A is a schematic diagram after a cathode is formed.
Figure 14B:
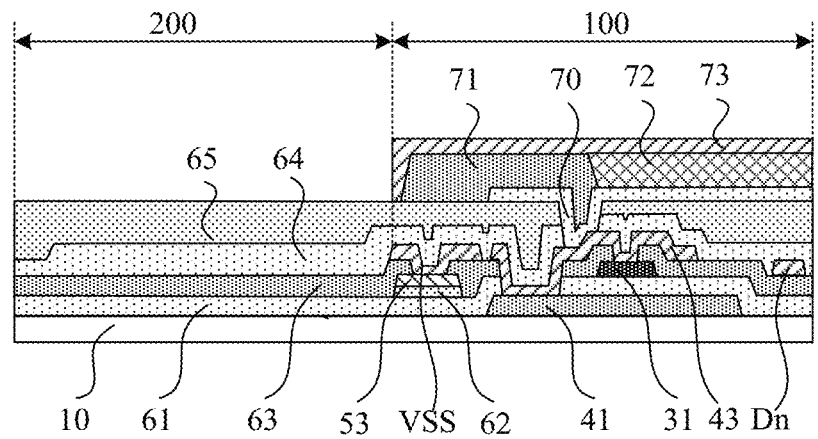
FIG. 14B is a sectional view of FIG. 14A in an A-A direction.
Figure 14C:
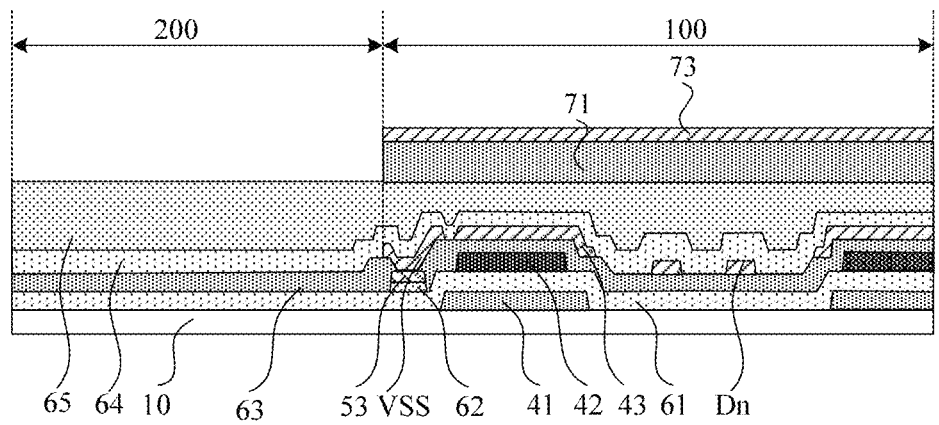
FIG. 14C is a sectional view of FIG. 14A in a B-B direction.

(10) Forming a cathode, which includes: coating a cathode thin film onto the substrate on which the organic light emitting layer is formed, and patterning the cathode thin film by a patterning process to form a cathode 73. The cathode is formed in the display area 100 and covers the organic light emitting layer in each light emitting structure. In the display area 100, the cathode 73 is connected with the organic light emitting layer 72, as shown in FIG. 14, wherein FIG. 14B is a sectional view of FIG. 14A in an A-A direction, and FIG. 14C is a sectional view of FIG. 14A in a B-B direction.

(11) Forming an encapsulation layer. An encapsulation layer is formed on the substrate on which the cathode is formed. The encapsulation layer is formed in the display area 100 and the transparent area 200. The encapsulation layer in the display area 100 includes a first encapsulation layer 74 of an inorganic material, a second encapsulation layer 75 of an organic material and a third encapsulation layer 76 of an inorganic material. The first encapsulation layer 74 is arranged on the cathode 73, the second encapsulation layer 75 is arranged on the first encapsulation layer 74, and the third encapsulation layer 76 is arranged on the second encapsulation layer 75, thereby forming an inorganic material/organic material/inorganic material stacked structure. The encapsulation layer in the transparent area 200 includes a first encapsulation layer 74 of an inorganic material and a third encapsulation layer 76 of an inorganic material. The first encapsulation layer 74 is arranged on the cathode 73 and the third encapsulation layer 76 is arranged on the first encapsulation layer 74, thereby forming an inorganic material/inorganic material stacked structure, as shown in FIG. 15.

(12) Forming a color filter layer and a shielding layer on the encapsulation layer, as shown in FIG. 1B.

In an exemplary embodiment, the first metal layer, the second metal layer and the third metal layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), which may be a single-layer structure or a multi-layer composite structure, such as Mo/Cu/Mo. The first insulating layer, the second insulating layer, the third insulating layer and the fourth insulating layer may be made of any one or more of silicon oxide (SiOx), silicon nitride (SiNx) and silicon oxynitride (SiON), which may be a single layer, multiple layers or a composite layer. The first insulating layer is called a buffer layer, which is used for improving a capability of water and oxygen resistance of the substrate, the second insulating layer is called a gate insulating (GI) layer, the third insulating layer is called an interlayer dielectric (ILD) layer, and the fourth insulating layer is called a passivation (PVX) layer. The thickness of the second insulating layer is smaller than the thickness of the third insulating layer, and the thickness of the first insulating layer is smaller than the sum of the thicknesses of the second insulating layer and the thicknesses of the third insulating layer, which increases the capacity of the storage capacitor, while ensuring the insulating effect. The flat layer may be made of an organic material, the transparent conductive thin film may be made of indium tin oxide (ITO) or indium zinc oxide (IZO), and the pixel define layer may be made of polyimide, acrylic or polyethylene terephthalate. The second electrode may be made of any one or more of magnesium (Mg), silver (Ag), aluminum (Al), copper (Cu) and lithium (Li), or an alloy made of any one or more of the above metals.

In an exemplary embodiment, the first insulating layer has a thickness of 3000 angstroms to 5000 angstroms, the second insulating layer has a thickness of 1000 angstroms to 2000 angstroms, the third insulating layer has a thickness of 4500 angstroms to 7000 angstroms, and the fourth insulating layer has a thickness of 3000 angstroms to 5000 angstroms.

In an exemplary embodiment, the first metal layer has a thickness of 80 angstroms to 1200 angstroms, the second metal layer has a thickness of 3000 angstroms to 5000 angstroms, and the third metal layer has a thickness of 3000 angstroms to 9000 angstroms.

In an exemplary embodiment, the metal oxide layer may be made of oxides containing indium and tin, oxides containing tungsten and indium, oxides containing tungsten, indium and zinc, oxides containing titanium and indium, oxides containing titanium, indium and tin, oxides containing indium and zinc, oxides containing silicon, indium and tin, oxides containing indium, gallium and zinc, etc. The metal oxide layer may be a single layer, two layers, or multiple layers.

The structure shown in the present disclosure and the preparation process thereof are merely an exemplary description. In an exemplary embodiment, corresponding structures may be changed and patterning processes may be added or reduced according to actual needs. For example, the pixel driving circuit may be 5T1C or 7T1C. In another example, other electrodes or leads may be arranged in the film layer structure.

An embodiment of the present disclosure further provides a method for preparing a display substrate, including S1 and S2.

In S1, a substrate is provided.

In S2, a display unit including a display area and a transparent area is formed on the substrate to form a display substrate.

The display unit includes a driving structure layer, a light emitting structure layer and a color filter layer which are located in the display area and sequentially arranged on the substrate. The light emitting structure layer includes a plurality of light emitting structures each including a pixel define layer, a first electrode, an organic light emitting layer and a second electrode. The organic light emitting layer is located in an opening area of the pixel define layer and on the pixel define layer. The display substrate includes a spacing area located in the display area. The spacing area is located between opening areas of pixel define layers of adjacent light emitting structures, and there is an overlapping area between the orthographic projection of the spacing area on the substrate and the orthographic projection of the pixel define layer on the substrate. The color filter layer includes a plurality of light filters. There is an overlapping area between the orthographic projections of adjacent light filters on the substrate. There is an overlapping area between the orthographic projection of an overlapping area of adjacent light filters on the substrate and the orthographic projection of the spacing area on the substrate.

The display substrate is the display substrate provided in the preceding embodiments, and has similar implementation principles and implementation effects, which will not be described further here.

In an exemplary embodiment, step S1 includes: forming on the substrate a first metal layer which is located in the display area and includes a first plate; forming a first insulating layer which covers the first metal layer and is located in the display area and the transparent area; forming on the first insulating layer a metal oxide layer which is located in the display area and includes a second plate, there being an overlapping area between an orthographic projection of the second plate on the substrate and an orthographic projection of the first plate on the substrate to form a first storage capacitor; sequentially forming a second insulating layer and a second metal layer which are located in the display area, the second metal layer including a first scanning line and a second scanning line; forming a third insulating layer which covers the second metal layer and is located in the display area and the transparent area; forming on the third insulating layer a third metal layer which is located in the display area, the third metal layer including a first power supply line, a second power supply line, a compensation line, a data line and a third plate, there being an overlapping area between an orthographic projection of the third plate on the substrate and the orthographic projection of the second plate on the substrate to form a second storage capacitor, and the third plate being connected with the first plate through a via hole; forming a fourth insulating layer and a flat layer which cover the third metal layer and are located in the display area and the transparent area; forming a first electrode on the flat layer; sequentially forming a pixel define layer, an organic light emitting layer and a cathode; forming an encapsulation layer; and forming a color filter layer on the encapsulation layer.

In an exemplary embodiment, forming a color filter layer on the encapsulation layer includes forming a color filter layer and a shielding layer on the encapsulation layer.

An embodiment of the present disclosure further provides a display apparatus, including the display substrate according to any of the aforementioned embodiments.

In an exemplary embodiment, the display apparatus may be any product or component with a display function such as a mobile phone, a tablet computer, a television, a display, a notebook computer, a digital photo frame, a navigator, etc.

The drawings in the present disclosure only refer to the structures involved in the present disclosure, and common designs may be referred to for other structures. Without conflict, the embodiments of the present disclosure, i.e., the features in the embodiments, may be combined with each other to obtain a new embodiment.

Those of ordinary skills in the art should understand that modifications or equivalent substitutions may be made to the technical solutions of the present disclosure without departing from the spirit and scope of the technical solutions of the present disclosure, all of which should be contained within the scope of the claims of the present disclosure.

What is claimed is:

1. A display substrate, comprising:
a substrate and a plurality of display units arranged on the substrate,
wherein:
the display unit comprises a display area and a transparent area; the display unit comprises a driving structure layer, a light emitting structure layer and a color filter layer which are located in the display area and sequentially arranged on the substrate; the light emitting structure layer comprises a plurality of light emitting structures each comprising a pixel define layer, a first electrode, an organic light emitting layer and a second electrode; the organic light emitting layer is located in an opening area of the pixel define layer and on the pixel define layer; the color filter layer comprises a plurality of light filters;
the display substrate comprises a spacing area located in the display area, wherein the spacing area is located between opening areas of pixel define layers of adjacent light emitting structures, and there is an overlapping area between an orthographic projection of the spacing area on the substrate and an orthographic projection of the pixel define layer on the substrate; and
there is an overlapping area between orthographic projections of adjacent light filters on the substrate, and there is an overlapping area between an orthographic projection of an overlapping area of adjacent light filters on the substrate and the orthographic projection of the spacing area on the substrate;
the plurality of light emitting structures comprise a first light emitting structure, a second light emitting structure, a third light emitting structure and a fourth light emitting structure; the first light emitting structure and the second light emitting structure are arranged in a first direction, the third light emitting structure and the fourth light emitting structure are arranged in the first direction; the first light emitting structure and the third light emitting structure are arranged in a second direction, and the second light emitting structure and the fourth light emitting structure are arranged in the second direction;
the driving structure layer comprises: a plurality of first scanning lines and second scanning lines extending in the first direction, a plurality of first power supply lines, second power supply lines extending in the second direction;
the spacing area comprises a first spacing area, a second spacing area and a third spacing area;
the first spacing area is located between the opening area of the pixel define layer of the first light emitting structure and the opening area of the pixel define layer of the third light emitting structure, and the second spacing area is located between the opening area of the pixel define layer of the second light emitting structure and the opening area of the pixel define layer of the fourth light emitting structure; and the first spacing area and the second spacing area are arranged in the first direction;
the first spacing area and the second spacing area are located on two sides of the third spacing area, respectively;
the third spacing area comprises: a first sub-spacing area, a second sub-spacing area and a third sub-spacing area which are sequentially arranged in the second direction and connected end to end; and the second sub-spacing area is located between the first sub-spacing area and the third sub-spacing area;
the first sub-spacing area is located between the opening area of the pixel define layer of the first light emitting structure and the opening area of the pixel define layer of the second light emitting structure; and the third sub-spacing area is located between the opening area of the pixel define layer of the third light emitting structure and the opening area of the pixel define layer of the fourth light emitting structure;

the second sub-spacing area is located between the first spacing area and the second spacing area, and is arranged in the first direction with the first spacing area and the second spacing area;

when the light filters are located on the first light emitting structure, an orthographic projection of the light filters located on the first light emitting structure on the substrate covers the orthographic projections of the opening area of the pixel define layer of the first light emitting structure, the first sub-spacing area and the second sub-spacing area on the substrate, and overlaps with the orthographic projections of partial second scanning lines and partial second power supply lines in the display area on the substrate;

when the light filters are located on the second light emitting structure, the orthographic projection of the light filters located on the second light emitting structure on the substrate covers the orthographic projections of the opening area of the pixel define layer of the second light emitting structure, the second spacing area, the first sub-spacing area and the second sub-spacing area on the substrate, and overlaps with the orthographic projections of partial second scanning lines and partial first power supply lines located in the display area on the substrate;

when the light filters are located on the third light emitting structure, the orthographic projection of the light filters located on the third light emitting structure on the substrate covers the orthographic projection of the opening area of the pixel define layer of the third light emitting structure on the substrate, and overlaps with the orthographic projections of partial first spacing area, partial third sub-spacing area, and orthographic projections of partial first scanning lines and partial second power supply lines located in the display area on the substrate; and when the light filters are located on the fourth light emitting structure, the orthographic projection of the light filters located on the fourth light emitting structure on the substrate covers the orthographic projection of the opening area of the pixel define layer of the fourth light emitting structure on the substrate, and overlaps with the orthographic projections of partial second spacing area, partial third sub-spacing area, and orthographic projections of partial first scanning lines and partial first power supply lines in the display area on the substrate.

2. The display substrate according to claim 1, wherein the plurality of light filters comprise a light filter of a first color, a light filter of a second color and a light filter of a third color; the light filters of the three colors are respectively arranged on three of the four light emitting structures; and wherein the first direction is an arrangement direction of the transparent area and the display area in one display unit, the second direction is perpendicular to the first direction, the first color, the second color and the third color are respectively one of red, blue and green, and the three colors are different from each other.

3. The display substrate according to claim 2, wherein the driving structure layer further comprises: data lines and compensation lines extending in the second direction, and a first driving structure, a second driving structure, a third driving structure and a fourth driving structure which are arranged in the first direction;

the first driving structure is located on a side of the second driving structure close to the transparent area, and the fourth driving structure is located on a side of the third driving structure away from the transparent area;

the first power supply lines are located on a side of the fourth driving structure away from the third driving structure; the second power supply lines are located on a side of the first driving structure away from the second driving structure; and the compensation lines are located between the second driving structure and the third driving structure;

the data lines comprise: a first data line, a second data line, a third data line and a fourth data line;

the first data line is connected with the first driving structure and located on a side of the first driving structure close to the second driving structure; the second data line is connected with the second driving structure and located on a side of the second driving structure close to the first driving structure; the third data line is connected with the third driving structure and located on a side of the third driving structure close to the fourth driving structure; and the fourth data line is connected with the fourth driving structure and located on a side of the fourth driving structure close to the third driving structure;

the first scanning lines and the second scanning lines are located on two sides of the driving structure layer, respectively;

a length of the first power supply line in the first direction is greater than a length of the compensation line or the data line in the first direction, and a length of the second power supply line in the first direction is greater than a length of the compensation line or the data line in the first direction.

4. The display substrate according to claim 3, wherein the first driving structure and the fourth driving structure are mirror symmetric with respect to the compensation line, and the second driving structure and the third driving structure are mirror symmetric with respect to the compensation line.

5. The display substrate according to claim 4, wherein each of the driving structure comprises a pixel driving circuit, the pixel driving circuit comprises: a first transistor, a second transistor, a third transistor and a storage capacitor; the second transistor is a driving transistor; the storage capacitor comprises a first plate, a second plate and a third plate;

a gate electrode of the first transistor is connected with the first scanning line, a first electrode of the first transistor is connected with the data line, a second electrode of the first transistor is connected with a gate electrode of the second transistor, a first electrode of the second transistor is connected with the first power supply line, a second electrode of the second transistor is connected with the first electrode of the light emitting structure, a gate electrode of the third transistor is connected with the second scanning line, a first electrode of the third transistor is connected with the compensation line through a compensation connection line, a second electrode of the third transistor is connected with the second electrode of the second transistor, the second electrode of the light emitting structure is connected with the second power supply line, the first plate and the third plate are connected with the second electrode of the second transistor, and the second plate is connected with the gate electrode of the second transistor;

the driving structure layer further comprises: a power supply connection line, an auxiliary power supply line and a compensation connection line;

the first electrode of the second transistor is connected with the first power supply line through the power supply connection line; the power supply connection line is arranged on a same layer as the first scanning line and the second scanning line, the first power supply line is connected with the power supply connection line through a via hole, and a double-layer routing is formed between the gate electrode of the first transistor and the gate electrode of the third transistor;

the auxiliary power supply line is arranged on the same layer as the first scanning line and the second scanning line, the second power supply line is connected with the auxiliary power supply line through a via hole, and a double-layer routing is formed between the gate electrode of the first transistor and the gate electrode of the third transistor;

the compensation connection line is arranged on a same layer as the first plate, and is connected with the compensation line through a via hole.

6. The display substrate according to claim 5, wherein the driving structure layer comprises: a first metal layer, a first insulating layer, a metal oxide layer, a second insulating layer, a second metal layer, a third insulating layer, a third metal layer, a fourth insulating layer and a flat layer which are sequentially stacked;

the first metal layer comprises a first plate and a compensation connection line, the metal oxide layer comprises a second plate and active layers of all transistors, the second metal layer comprises a first scanning line, a second scanning line, a power supply connection line, an auxiliary power supply line and gate electrodes of all transistors, the third metal layer comprises a first power supply line, a second power supply line, a compensation line, data lines, a third plate and source and drain electrodes of all transistors; and the flat layer is provided with a via hole exposing the second electrode of the second transistor;

there is an overlapping area between an orthographic projection of the first plate on the substrate and an orthographic projection of the second plate on the substrate to form a first storage capacitor, and there is an overlapping area between an orthographic projection of the third plate on the substrate and an orthographic projection of the second plate on the substrate to form a second storage capacitor, and the third plate is connected with the first plate through a via hole.

7. The display substrate according to claim 6, wherein the orthographic projection of the first plate on the substrate covers orthographic projections of the active layers of all the transistors and the orthographic projection of the second plate on the substrate;

a length of the first plate along the second direction is greater than a distance between the gate electrode of the first transistor and the gate electrode of the third transistor.

8. The display substrate according to claim 7, wherein the first transistor and the second transistor are located on a side of the second plate close to the first scanning line, and the third transistor is located on a side of the second plate close to the second scanning line.

9. The display substrate according to claim 8, wherein the second plates in the second driving structure and the third driving structure are provided with an opening respectively; the opening of the second plate of the second driving structure is arranged on a side of the second driving structure close to the third driving structure, and the opening of the second plate of the third driving structure is arranged on a side of the third driving structure close to the second driving structure;

the via holes of the flat layers in the first driving structure and the fourth driving structure are located between the third transistor and the second plate, and the via hole of the flat layer in the first driving structure and the via hole of the flat layer in the fourth driving structure are mirror symmetric with respect to the compensation line;

the via hole of the flat layer of the second driving structure is located in the opening of the second plate of the second driving structure, and the via hole of the flat layer of the third driving structure is located in the opening of the second plate of the third driving structure; and the via hole of the flat layer in the second driving structure and the via hole of the flat layer in the third driving structure are mirror symmetric with respect to the compensation line;

an included angle between the first direction and an arrangement direction of the via hole of the flat layer in the first driving structure and the via hole of the flat layer in the second driving structure is greater than 0 degree and smaller than 90 degrees.

10. The display substrate according to claim 9, wherein the first electrode of the first light emitting structure is connected with the first driving structure through the via hole of the flat layer in the first driving structure, the first electrode of the second light emitting structure is connected with the fourth driving structure through the via hole of the flat layer in the fourth driving structure, a first electrode of the third light emitting structure is connected with the second driving structure through the via hole of the flat layer in the second driving structure, and the first electrode of the fourth light emitting structure is connected with the third driving structure through the via hole of the flat layer in the third driving structure;

the opening area of the pixel define layer of the first light emitting structure and the opening area of the pixel define layer of the third light emitting structure are located between the first power supply line and the compensation line, and there is an overlapping area between the orthographic projections of the opening area of the pixel define layer of the first light emitting structure and the opening area of the pixel define layer of the third light emitting structure on the substrate and the orthographic projections of the first driving structure and the second driving structure on the substrate;

the opening area of the pixel define layer of the second light emitting structure and the opening area of the pixel define layer of the fourth light emitting structure are located between the compensation line and the second power supply line, and there is an overlapping area between the orthographic projections of the opening area of the pixel define layer of the second light emitting structure and the opening area of the pixel define layer of the fourth light emitting structure on the substrate and the orthographic projections of the third driving structure and the fourth driving structure on the substrate.

11. The display substrate according to claim 10, wherein there is no overlapping area between the orthographic projection of the via hole of the flat layer of the first driving structure on the substrate and the orthographic projection of the opening area of the pixel define layer in the first light emitting structure on the substrate;

there is no overlapping area between the orthographic projection of the via hole of the flat layer of the second driving structure on the substrate and the orthographic projection of the opening area of the pixel define layer in the third light emitting structure on the substrate;

there is no overlapping area between the orthographic projection of the via hole of the flat layer of the third driving structure on the substrate and the orthographic projection of the opening area of the pixel define layer in the fourth light emitting structure on the substrate; and there is no overlapping area between the orthographic projection of the via hole of the flat layer of the fourth driving structure on the substrate and the orthographic projection of the opening area of the pixel define layer in the second light emitting structure on the substrate.

12. The display substrate according to claim 11, wherein an orthographic projection of the third spacing area on the substrate coincides with an orthographic projection of the compensation line between the first scanning line and the second scanning line on the substrate.

13. The display substrate according to claim 1, wherein there is no overlapping area between an orthographic projection of the color filter layer on the substrate and an orthographic projection of the via hole of the flat layer in the driving structure layer on the substrate.

14. The display substrate according to claim 13, wherein the display substrate further comprises a shielding layer;

there is an overlapping area between an orthographic projection of the shielding layer on the substrate and orthographic projections of the first scanning lines in the transparent area and the second scanning lines in the transparent area and part of the display area on the substrate.

15. The display substrate according to claim 14, wherein the shielding layer comprises a first shielding layer and a second shielding layer; the second shielding layer is located on a side of the first shielding layer close to the substrate;

the first shielding layer is arranged on a same layer as light filters of one color among the plurality of light filters, and the second shielding layer is arranged on a same layer as light filters of another color among the plurality of light filters.

16. A method for preparing a display substrate, which is used for preparing the display substrate according to claim 1, the method comprising:

providing the substrate; and forming the display unit comprising the display area and the transparent area on the substrate to form the display substrate, wherein the display unit comprises the driving structure layer, the light emitting structure layer and the color filter layer which are located in the display area and sequentially arranged on the substrate; the light emitting structure layer comprises the plurality of light emitting structures each comprising the pixel define layer, the first electrode, the organic light emitting layer and the second electrode; the organic light emitting layer is located in the opening area of the pixel define layer and on the pixel define layer; the display substrate comprises the spacing area located in the display area, the spacing area being located between the opening areas of the pixel define layers of adjacent light emitting structures, and there is the overlapping area between the orthographic projection of the spacing area on the substrate and the orthographic projection of the pixel define layer on the substrate; the color filter layer comprises the plurality of light filters; there is the overlapping area between the orthographic projections of adjacent light filters on the substrate; and there is the overlapping area between the orthographic projection of the overlapping area of adjacent light filters on the substrate and the orthographic projection of the spacing area on the substrate.

17. The method according to claim 16, wherein forming the display unit comprising the display area and the transparent area on the substrate comprises:

forming on the substrate a first metal layer which is located in the display area and comprises a first plate;

forming a first insulating layer which covers the first metal layer and is located in the display area and the transparent area;

forming on the first insulating layer a metal oxide layer which is located in the display area and comprises a second plate, wherein there is an overlapping area between an orthographic projection of the second plate on the substrate and an orthographic projection of the first plate on the substrate to form a first storage capacitor;

sequentially forming a second insulating layer and a second metal layer which are located in the display area, wherein the second metal layer comprises a first scanning line and a second scanning line;

forming a third insulating layer which covers the second metal layer and is located in the display area and the transparent area;

forming on the third insulating layer a third metal layer which is located in the display area, wherein the third metal layer comprises a first power supply line, a second power supply line, a compensation line, data lines and a third plate, there is an overlapping area between an orthographic projection of the third plate on the substrate and the orthographic projection of the second plate on the substrate to form a second storage capacitor, and the third plate is connected with the first plate through a via hole;

forming a fourth insulating layer and a flat layer which cover the third metal layer and are located in the display area and the transparent area;

forming a first electrode on the flat layer;

sequentially forming a pixel define layer, an organic light emitting layer and a cathode;

forming an encapsulation layer; and forming a color filter layer on the encapsulation layer.

18. The method according to claim 17, wherein forming the color filter layer on the encapsulation layer comprises:

forming the color filter layer and a shielding layer on the encapsulation layer, wherein there is an overlapping area between an orthographic projection of the shielding layer on the substrate and orthographic projections of the first scanning line located in the transparent area and the second scanning line located in the transparent area and part of the display area on the substrate.

19. A display apparatus, comprising the display substrate according to claim 1.

* * * * *